United States Patent
Naohara et al.

(10) Patent No.: US 11,908,752 B2
(45) Date of Patent: Feb. 20, 2024

(54) SUBSTRATE PROCESSING APPARATUS AND SUBSTRATE PROCESSING METHOD

(71) Applicant: SCREEN Holdings Co., Ltd., Kyoto (JP)

(72) Inventors: Hideji Naohara, Kyoto (JP); Yuji Okita, Kyoto (JP); Hiroaki Kakuma, Kyoto (JP); Tatsuya Masui, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 416 days.

(21) Appl. No.: 17/281,281

(22) PCT Filed: Sep. 25, 2019

(86) PCT No.: PCT/JP2019/037585
§ 371 (c)(1),
(2) Date: Mar. 30, 2021

(87) PCT Pub. No.: WO2020/071206
PCT Pub. Date: Sep. 4, 2020

(65) Prior Publication Data
US 2022/0005736 A1 Jan. 6, 2022

(30) Foreign Application Priority Data
Oct. 5, 2018 (JP) .................................. 2018-189980

(51) Int. Cl.
*H01L 21/02* (2006.01)
*H01L 21/67* (2006.01)
(Continued)

(52) U.S. Cl.
CPC ............ *H01L 22/12* (2013.01); *G06T 7/0004* (2013.01); *G06T 7/11* (2017.01); *G06T 7/73* (2017.01);
(Continued)

(58) Field of Classification Search
CPC ........... H01L 21/30604; H01L 21/6708; H01L 21/67051; H01L 21/67253;
(Continued)

(56) References Cited

U.S. PATENT DOCUMENTS

2008/0100809 A1    5/2008  Nakashima et al. ............ 355/27
2011/0286738 A1*  11/2011  Noda ................. H01L 21/67253
                                                                  396/611
(Continued)

FOREIGN PATENT DOCUMENTS

JP    2008-135679 A    6/2008
JP    2011-181588 A    9/2011
(Continued)

OTHER PUBLICATIONS

International Search Report dated Dec. 3, 2019 in corresponding PCT International Application No. PCT/JP2019/037585.
(Continued)

*Primary Examiner* — Omar F Mojaddedi
(74) *Attorney, Agent, or Firm* — OSTROLENK FABER LLP

(57) ABSTRACT

A substrate processing apparatus that includes a substrate holder, a cup member, an elevating mechanism, a first nozzle, and a camera. The substrate holder holds a substrate and rotates the substrate. The cup member surrounds the outer circumference of the substrate holder. The elevating mechanism moves up the cup member so that the upper end portion of the cup member is located at the upper end position higher than the substrate held by the substrate holder. The first nozzle has a discharge port at a position lower than the upper end position, and discharges first processing liquid from the discharge port to an end portion of the substrate. The camera images an imaging region that includes the first processing liquid discharged from the
(Continued)

discharge port of the first nozzle and is viewed from an imaging position above the substrate.

19 Claims, 13 Drawing Sheets

(51) Int. Cl.
| | |
|---|---|
| *H01L 21/306* | (2006.01) |
| *H01L 21/687* | (2006.01) |
| *G06T 7/00* | (2017.01) |
| *G06T 7/11* | (2017.01) |
| *G06T 7/73* | (2017.01) |
| *H04N 23/58* | (2023.01) |
| *H04N 23/695* | (2023.01) |
| *H01L 21/66* | (2006.01) |

(52) U.S. Cl.
CPC .... *H01L 21/30604* (2013.01); *H01L 21/6708* (2013.01); *H04N 23/58* (2023.01); *H04N 23/695* (2023.01); *G06T 2207/20216* (2013.01); *G06T 2207/30148* (2013.01)

(58) Field of Classification Search
CPC ......... H01L 21/67259; H01L 21/67288; H01L 21/02057; H01L 21/02087; H01L 21/68764; H01L 22/12; B05C 11/00; B05C 11/02; B05C 11/08; B05C 11/10; B05D 3/00; B05D 3/10; B05D 1/40; G06T 7/0004; G06T 7/11; G06T 7/73; H04N 23/58; H04N 23/695
See application file for complete search history.

(56) References Cited

U.S. PATENT DOCUMENTS

| | | | | |
|---|---|---|---|---|
| 2015/0001087 A1* | 1/2015 | Dinneen | ........... | H01L 21/67253 204/216 |
| 2015/0013722 A1* | 1/2015 | Amano | ............. | H01L 21/67051 134/57 R |
| 2015/0235368 A1* | 8/2015 | Kakuma | .................... | G06T 7/73 348/135 |
| 2015/0270146 A1* | 9/2015 | Yoshihara | ......... | H01L 21/67103 134/18 |
| 2016/0237567 A1* | 8/2016 | Sieber | ............... | C23C 16/45508 |
| 2017/0028426 A1* | 2/2017 | Kakuma | ........... | H01L 21/67253 |
| 2020/0006099 A1* | 1/2020 | Yamauchi | ........... | H01L 21/6838 |

FOREIGN PATENT DOCUMENTS

| | | | |
|---|---|---|---|
| JP | 2012-009812 | A | 1/2012 |
| JP | 2015-018848 | A | 1/2015 |
| JP | 2015-152475 | A | 8/2015 |
| JP | 2015-173148 | A | 10/2015 |
| JP | 2016-122681 | A | 7/2016 |
| JP | 2016-136572 | A | 7/2016 |
| JP | 2017-029883 | A | 2/2017 |
| KR | 10-2011-0128231 | A | 11/2011 |
| KR | 10-2015-0097370 | A | 8/2015 |

OTHER PUBLICATIONS

Written Opinion dated Dec. 3, 2019 in corresponding PCT International Application No. PCT/JP2019/037585.
Office Action dated Nov. 30, 2020 in corresponding Taiwanese Patent Application No. 108135677, along with a partial English translation based on a Japanese translation.
Notice of Reasons for Refusal dated Aug. 2, 2022 in corresponding Japanese Patent Application No. 2018-189980 with English translation obtained from the Global Dossier.
International Preliminary Report on Patentability and Written Opinion dated Apr. 15, 2021 in corresponding International Application No. PCT/JP2019/037585 with English translation.
Request for the Submission of an Opinion dated Jul. 1, 2022 in corresponding Korean Patent Application No. 10-2021-7009872 with English translation obtained from the Global Dossier.

* cited by examiner

F I G. 4
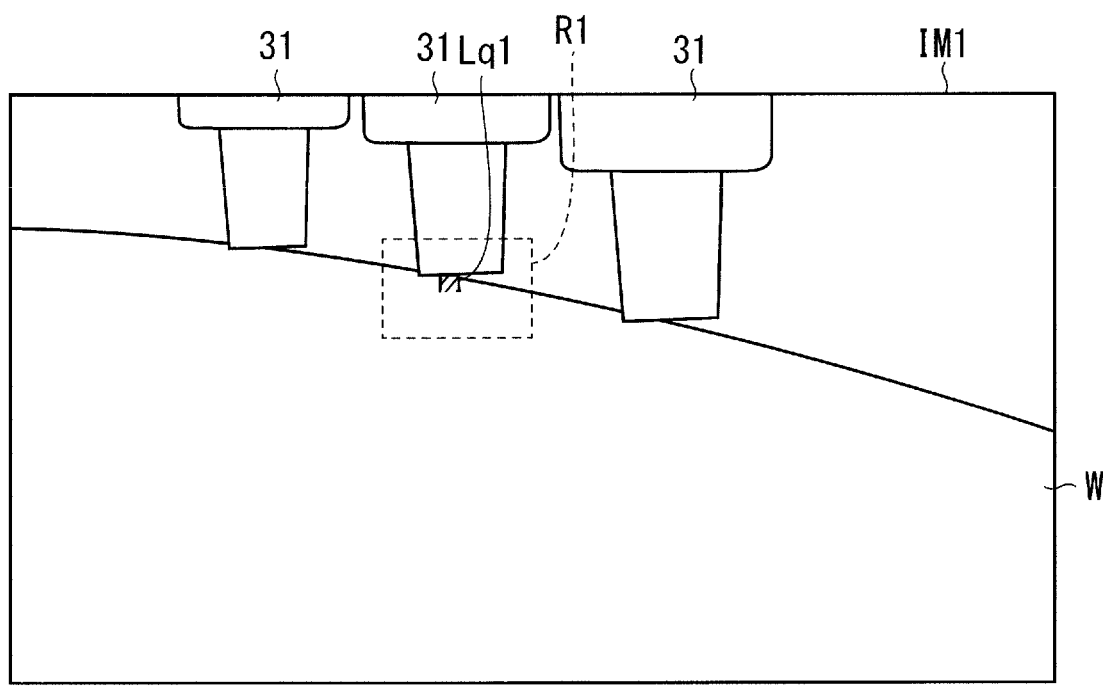

SUBSTRATE PROCESSING APPARATUS AND SUBSTRATE PROCESSING METHOD

CROSS-REFERENCE TO RELATED APPLICATIONS

The present application is a 35 U.S.C. §§ 371 national phase conversion of International Application No. PCT/JP2019/037585, filed Sep. 25, 2019, which claims priority to Japanese Patent Application No. 2018-189980, filed Oct. 5, 2018, the contents of both of which are incorporated herein by reference. The PCT International Application was published in the Japanese language.

TECHNICAL FIELD

The present invention relates to a substrate processing apparatus and a substrate processing method.

BACKGROUND ART

As an apparatus that processes a substrate, a substrate processing apparatus that discharges processing liquid from a discharge nozzle to the surface of a substrate while rotating the substrate in a horizontal plane is used. The processing liquid that lands on substantially the center of the substrate from the discharge nozzle spreads over the entire surface due to the centrifugal force accompanying the rotation of the substrate, and scatters outward from the peripheral edge of the substrate. By spreading over the entire surface of the substrate, the processing liquid can act on the entire surface of the substrate. As the processing liquid, a chemical solution, a cleaning solution, or the like is employed according to the processing of the substrate.

In such a substrate processing apparatus, a technique of providing a camera has been proposed in order to monitor whether or not the processing liquid is properly discharged (Patent Documents 1 to 5).

Further, in a manufacturing process of a semiconductor substrate, various films remaining on a peripheral end portion of the substrate may adversely affect a device surface of the substrate.

In view of the above, conventionally, a bevel processing for removing the film from a peripheral end portion of the substrate has been proposed. In the bevel processing, processing liquid for removal is discharged from a discharge nozzle to an end portion of the substrate while a substrate is rotated in a horizontal plane, so that a film at a peripheral end portion of the substrate is removed by the processing liquid.

PRIOR ART DOCUMENTS

Patent Documents

Patent Document 1: Japanese Patent Application Laid-Open No. 2015-173148

Patent Document 2: Japanese Patent Application Laid-Open No. 2017-29883

Patent Document 3: Japanese Patent Application Laid-Open No. 2015-18848

Patent Document 4: Japanese Patent Application Laid-Open No. 2016-122681

Patent Document 5: Japanese Patent Application Laid-Open No. 2008-135679

SUMMARY

Problem to be Solved by the Invention

In the bevel processing, processing liquid needs to be supplied only to an end portion of a substrate. Accordingly, a flow rate of the processing liquid is low. That is, the liquid-columnar processing liquid discharged from a discharge nozzle is thin. Therefore, this liquid-columnar processing liquid is easily affected by various factors such as the air flow accompanying the rotation of the substrate and the static electricity generated in the surroundings, and a discharge state of the processing liquid is liable to fluctuate. Specifically, due to the various factors, a liquid landing position of the processing liquid on the substrate may be displaced, or the liquid may splash. It is desirable that the discharge state of the processing liquid be monitored, because the displacement of the liquid landing position and the occurrence of liquid splash adversely affect a process.

However, in the bevel processing, since the distance between the discharge nozzle and the substrate is narrow, contrivance needs to be made to image the liquid-columnar processing liquid discharged from the discharge nozzle.

In view of the above, an object of the present application is to provide a substrate processing apparatus capable of imaging liquid-columnar processing liquid discharged to an end portion of a substrate.

Means to Solve the Problem

A first aspect of a substrate processing apparatus includes a substrate holder that holds a substrate and rotates the substrate, a cup member that surrounds an outer circumference of the substrate holder, an elevating mechanism that moves up the cup member so that an upper end portion of the cup member is located at an upper end position higher than the substrate held by the substrate holder, a first nozzle that has a discharge port at a position lower than the upper end position and discharges first processing liquid from the discharge port to an end portion of the substrate, and a camera that images an imaging region that includes the first processing liquid discharged from the discharge port of the first nozzle and is viewed from an imaging position above the substrate.

A second aspect of the substrate processing apparatus is the substrate processing apparatus according to the first aspect, further including a moving mechanism that moves the camera to the imaging position above the substrate. The imaging position is a position where a height position of a lower end of a light receiving surface of the camera is same as the upper end position of the cup member or a position lower than the upper end position.

A third aspect of the substrate processing apparatus is the substrate processing apparatus according to the first aspect, further including a mirror, and a moving mechanism that moves the mirror. The camera is arranged in a region other than above the substrate, and the moving mechanism moves the mirror to the imaging position above the substrate to cause the mirror to reflect light from the imaging region to the camera.

A fourth aspect of the substrate processing apparatus is the substrate processing apparatus according to the third aspect, in which the moving mechanism moves the mirror to a position where a lower end of a reflecting surface of the mirror is same as the upper end position of the cup member or a position lower than the upper end position.

A fifth aspect of the substrate processing apparatus is the substrate processing apparatus according to any one of the first to the fourth aspects, in which the imaging position is a position on an upstream side in a rotation direction of the substrate with respect to the first nozzle.

A sixth aspect of the substrate processing apparatus is the substrate processing apparatus according to claim 1, further including a moving mechanism that moves the camera to the imaging position above the substrate. The first processing liquid contains hydrofluoric acid, and a lower portion of the camera is covered with chemical resistant resin or metal.

A seventh aspect of the substrate processing apparatus is the substrate processing apparatus according to any one of the first to the sixth aspects, further including a fixing member for fixing the first nozzle, and a moving mechanism that displaces the fixing member to move the first nozzle to above the end portion of the substrate. The camera is fixed to the fixing member.

An eighth aspect of the substrate processing apparatus is the substrate processing apparatus according to any one of the first to the sixth aspects, further including a second nozzle that discharges second processing liquid to the substrate, a fixing member for fixing the second nozzle, and a moving mechanism that displaces the fixing member to move the second nozzle to above the substrate. The camera is fixed to the fixing member.

A ninth aspect of the substrate processing apparatus is the substrate processing apparatus according to any one of the first to the eighth aspects, in which the imaging region is an imaging region viewed along a direction closer to a circumferential direction than a radial direction of the substrate.

A first aspect of a substrate processing method includes, in the substrate processing apparatus according to any one of the first to ninth aspects, a holding step of holding a substrate by the substrate holder, a substrate rotation step of rotating the substrate holder that holds the substrate, a bevel processing step of discharging the first processing liquid from the first nozzle to an end portion of the substrate, and a bevel monitoring step of monitoring a discharge state of the first processing liquid based on a captured image acquired by the camera imaging the imaging region.

A second aspect of the substrate processing method is the substrate processing method according to the first aspect, in which, in the bevel processing step, the first processing liquid is discharged to the substrate from two or more discharge ports.

A third aspect of the substrate processing method is the substrate processing method according to the first or second aspect, in which, in the bevel monitoring step, a discharge state amount, which is a liquid column width or a discharge position of processing liquid discharged from a tip of the first nozzle, is obtained based on luminance values of pixels in a region located directly below the first nozzle and longer in a lateral direction than a length in a vertical direction in the captured image.

A fourth aspect of the substrate processing method is the substrate processing method according to the third aspect, in which the bevel monitoring step includes a step of obtaining a median or an average value of the discharge state amounts as a reference value, and a step of determining that abnormality has occurred in the first processing liquid when a difference between the discharge state amount and the reference value is equal to or more than a predetermined value.

A fifth aspect of the substrate processing method is the substrate processing method according to the third or the fourth aspect, in which the region is set to a position including a part of the first processing liquid reflected on an upper surface of a substrate by specular reflection in the captured image.

A sixth aspect of the substrate processing method is the substrate processing method according to the fifth aspect, in which exposure time of the camera is set to time required for one rotation of a substrate or longer.

A seventh aspect of the substrate processing method is the substrate processing method according to the fifth aspect, in which the discharge state amount is obtained based on luminance values of pixels in the region in a captured image obtained by integrating or averaging a plurality of captured images acquired by the camera within time required for one rotation of a substrate or longer.

An eighth aspect of the substrate processing method is the substrate processing method according to the first or the second aspect, in which, in the bevel monitoring step, a machine-learned classifier classifies the captured image into either a category without abnormality regarding a liquid column width or a discharge position of processing liquid discharged from a tip of the first nozzle, or a category with abnormality.

A ninth aspect of the substrate processing method is the substrate processing method according to the eighth aspect, in which, in the bevel monitoring step, a region located directly below the first nozzle and longer in a lateral direction than a length in a vertical direction is cut out from the captured image, and an image of the cut out region is input to the classifier.

A tenth aspect of the substrate processing method is the substrate processing method according to the first to the ninth aspect, in which the captured image includes a part of a peripheral edge of the substrate, and the bevel processing step includes a step of obtaining a substrate peripheral position of a part of a peripheral edge of the substrate based on the captured image, and a step of moving the first nozzle to a processing position on a central side of the substrate by a predetermined width from the substrate peripheral position.

Effects of the Invention

According to the first aspect of the substrate processing apparatus, the first processing liquid discharged from the first nozzle can be imaged.

According to the second aspect of the substrate processing apparatus, it is easy to align the optical axis of the camera more horizontally.

According to the third aspect of the substrate processing apparatus, the influence that the first processing liquid discharged on the substrate has on the camera can be reduced. For example, even if the first processing liquid contains hydrofluoric acid, a vaporization component of the first processing liquid is unlikely to be attached to the camera, and the possibility of corrosion of the camera can be reduced.

According to the fourth aspect of the substrate processing apparatus, it is easy to align the imaging direction from the imaging position horizontally.

According to the fifth aspect of the substrate processing apparatus, an amount of the first processing liquid on the peripheral edge portion of the substrate is smaller on the upstream side of the first nozzle than on the downstream side. Therefore, the influence of the first processing liquid on the substrate can be reduced.

According to the sixth aspect of the substrate processing apparatus, the possibility of corrosion of the camera can be reduced.

According to the seventh aspect of the substrate processing apparatus, the camera is fixed to the fixing member to which the first nozzle is fixed. Therefore, the camera can be positioned with high accuracy with respect to the first nozzle.

According to the eighth aspect of the substrate processing apparatus, since the mechanism for moving the camera is used also as the mechanism for moving the discharge nozzle, the manufacturing cost and size can be reduced.

According to the ninth aspect of the substrate processing apparatus, it is possible to allow the radial position of the liquid landing position on the substrate of the processing liquid to be easily seen.

According to the first and second aspects of the substrate processing method, the discharge state can be monitored based on an appropriate captured image.

According to the third aspect of the substrate processing method, since a luminance value of a pixel in a region that is long in the lateral direction is employed, even if the distance between the first nozzle and the substrate is small, the region can be easily set so that a part in the vertical direction of the discharged first processing liquid is included. Therefore, the discharge state amount can be appropriately obtained based on a pixel value in the region.

According to the fourth aspect of the substrate processing method, the operator can recognize abnormality.

According to the fifth aspect of the substrate processing method, the length of the liquid-columnar first processing liquid reflected on the upper surface of the substrate becomes long due to specular reflection, and the region can be easily set.

According to the sixth aspect of the substrate processing method, in the captured image, the pattern on the upper surface of the substrate is averaged and uniformed, so that the contour of the first processing liquid reflected on the upper surface of the substrate can be emphasized.

According to the seventh aspect of the substrate processing method, in the captured image, the pattern on the upper surface of the substrate is averaged and uniformed, so that the contour of the first processing liquid reflected on the upper surface of the substrate can be emphasized.

According to the eighth aspect of the substrate processing method, abnormality can be detected with high accuracy.

According to the ninth aspect of the substrate processing method, the classification can be performed by removing the influence of the region having low relevance to the discharge state, so that the classification accuracy can be improved.

According to the tenth aspect of the substrate processing method, the first nozzle can be moved to the processing position with high accuracy.

BRIEF DESCRIPTION OF DRAWINGS

FIG. 4 is a diagram schematically illustrating an example of a captured image acquired by a camera.

DESCRIPTION OF EMBODIMENT

Figure 1:
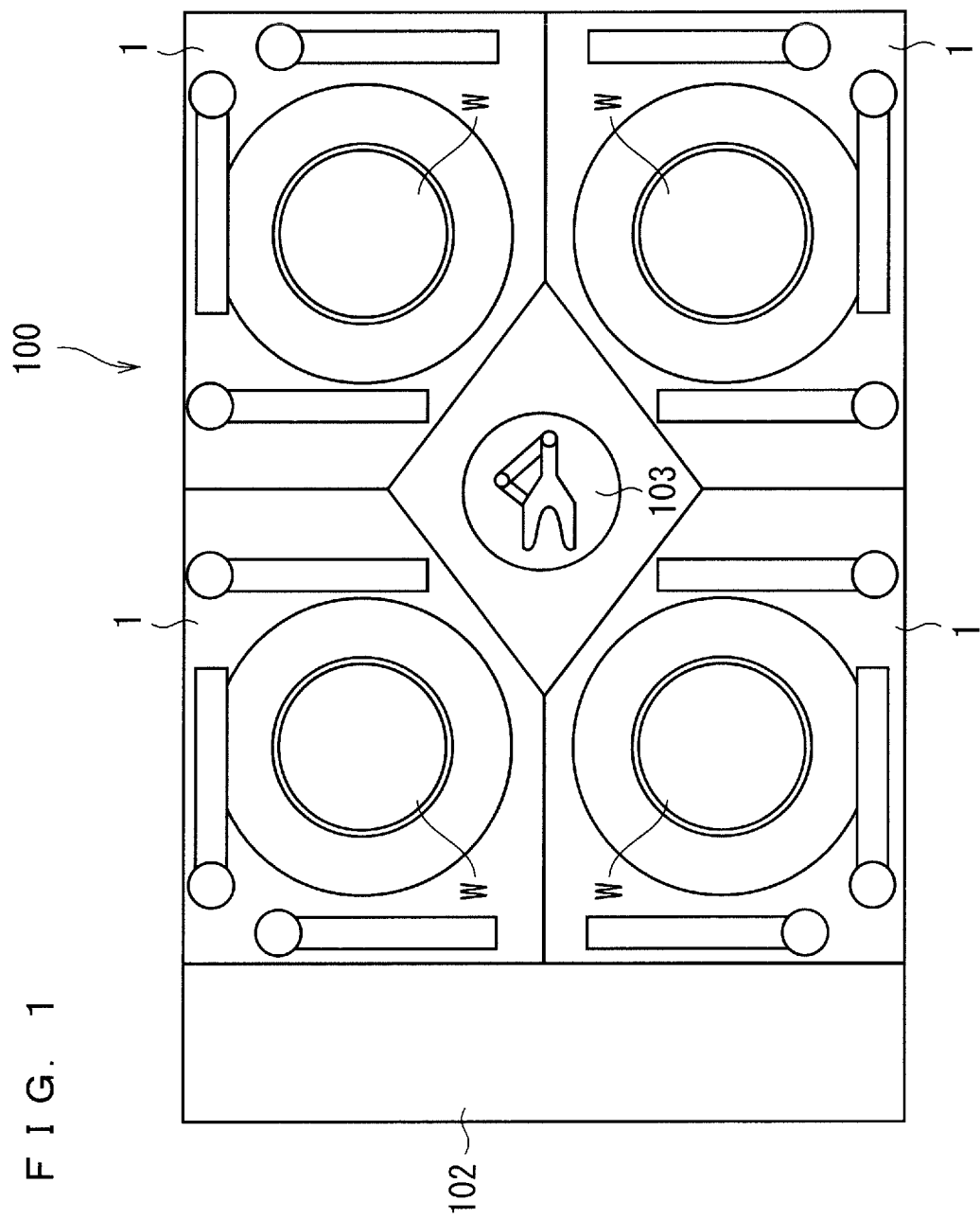
FIG. 1 is a diagram illustrating a schematic example of a configuration of a substrate processing apparatus.

Hereinafter, an embodiment will be described with reference to the attached drawings. Note that the drawings are shown schematically, and for convenience of explanation, the configuration is omitted or the configuration is simplified as appropriate. Further, an interrelationship between size and a position of a configuration and the like shown in the drawings is not always accurately described and may be changed as appropriate.

Further, in description shown below, similar constituents are illustrated with the same reference numerals. This similarly applies to their names and functions. Therefore, there is a case where detailed description of them is omitted to avoid duplication.

<Overview of Substrate Processing Apparatus>

FIG. 1 is a diagram illustrating an entire configuration of a substrate processing apparatus 100. The substrate processing apparatus 100 is an apparatus that supplies processing liquid to a substrate W to perform processing on the substrate W. The substrate W is, for example, a semiconductor substrate. The substrate W has a substantially disk shape.

The substrate processing apparatus 100 can remove an unnecessary substance adhered to a peripheral end portion of the substrate W by supplying the processing liquid to the end portion of the substrate W while rotating the substrate W in a horizontal plane. The width (width along the radial direction) of the peripheral end portion is, for example, about 0.5 to 3 [mm]. Examples of the unnecessary substance include films such as an SiO2 film, an SiN film, and a polysilicon film, a particle, and the like. Examples of the processing liquid for removing the unnecessary substance include hydrofluoric acid (HF), phosphoric acid (H3PO4), a mixed solution (SC-1) of ammonia (NH3) and hydrogen peroxide (H2O2), nitrohydrofluoric acid (a mixed solution of hydrofluoric acid and nitric acid (HNO3)), and the like. The substrate processing apparatus 100 removes the unnecessary substance by supplying the processing liquid to an end portion of the substrate W while rotating the substrate W. Such processing is also referred to as bevel processing.

The substrate processing apparatus 100 includes an indexer 102, a plurality of processing units 1, and a main conveyance robot 103. The indexer 102 has a function of carrying the unprocessed substrate W received from outside the apparatus into the apparatus and carrying out the processed substrate W out of the apparatus. The indexer 102 mounts a plurality of carriers and includes a transfer robot (all of which are not shown). As the carrier, a front opening unified pod (FOUP) or a standard mechanical inter face (SMIF) pod that stores the substrate W in a closed space, or an open cassette (OC) that exposes the substrate W to the outside air while in a stored state can be employed. The transfer robot transfers the substrate W between the carrier and the main conveyance robot 103.

Twelve of the processing units 1 are arranged in the substrate processing apparatus 100. The detailed arrangement configuration is that four towers in which three of the processing units 1 are stacked are arranged so as to surround the main conveyance robot 103. In other words, four of the processing units 1 arranged around the main conveyance robot 103 are stacked in three stages, and FIG. 1 shows one of them. Note that the number of the processing units 1 mounted on the substrate processing apparatus 100 is not limited to 12, and may be, for example, 8 or 4.

The main conveyance robot 103 is installed in the center of four of the towers in which the processing units 1 are stacked. The main conveyance robot 103 carries the unprocessed substrate W received from the indexer 102 into each of the processing units 1, and also carries out the processed substrate W from each of the processing units 1 and passes the substrate W to the indexer 102.

<Processing Unit>

Figure 2:
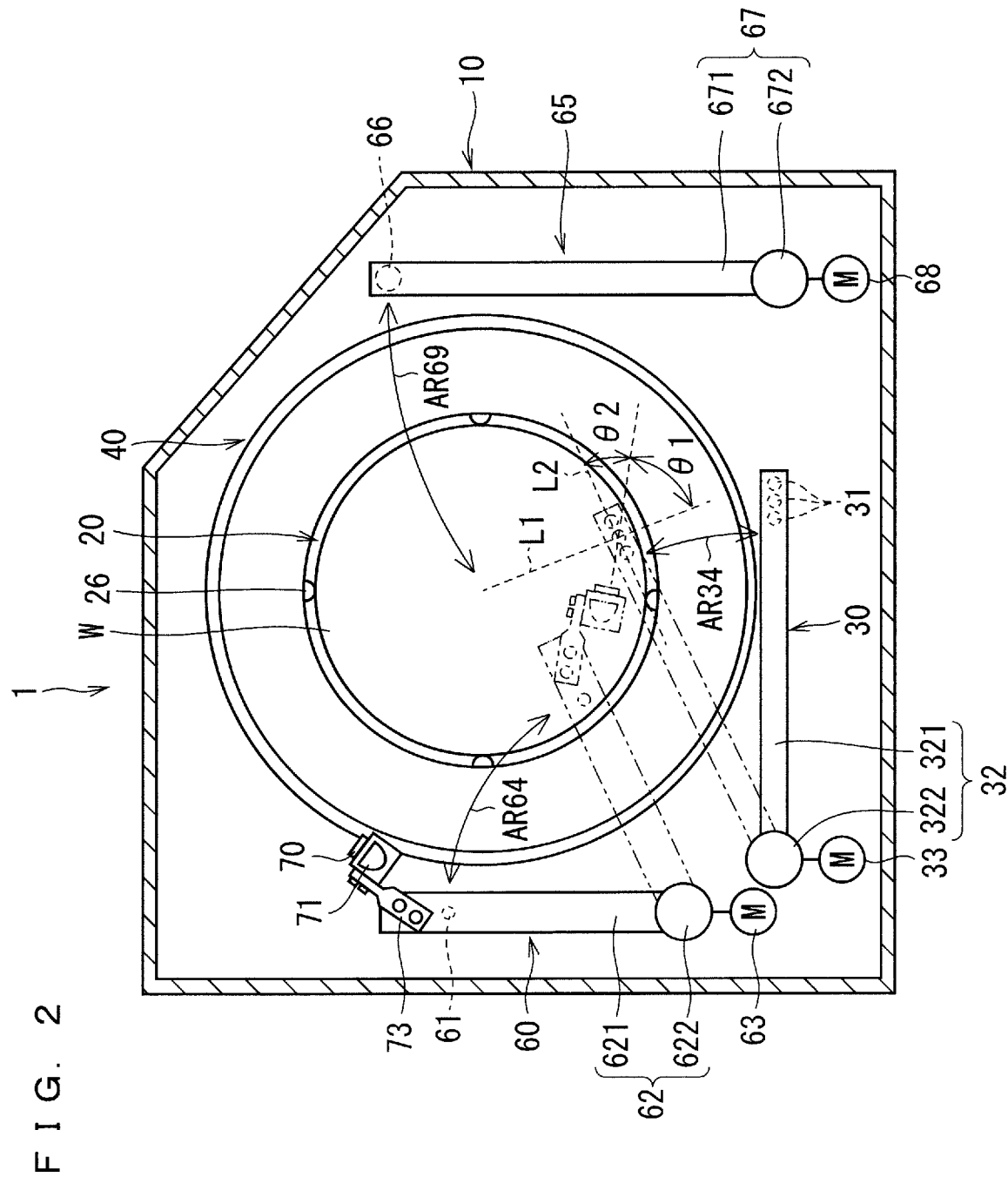
FIG. 2 is a plan view illustrating a schematic example of a configuration of a processing unit.
Figure 3:
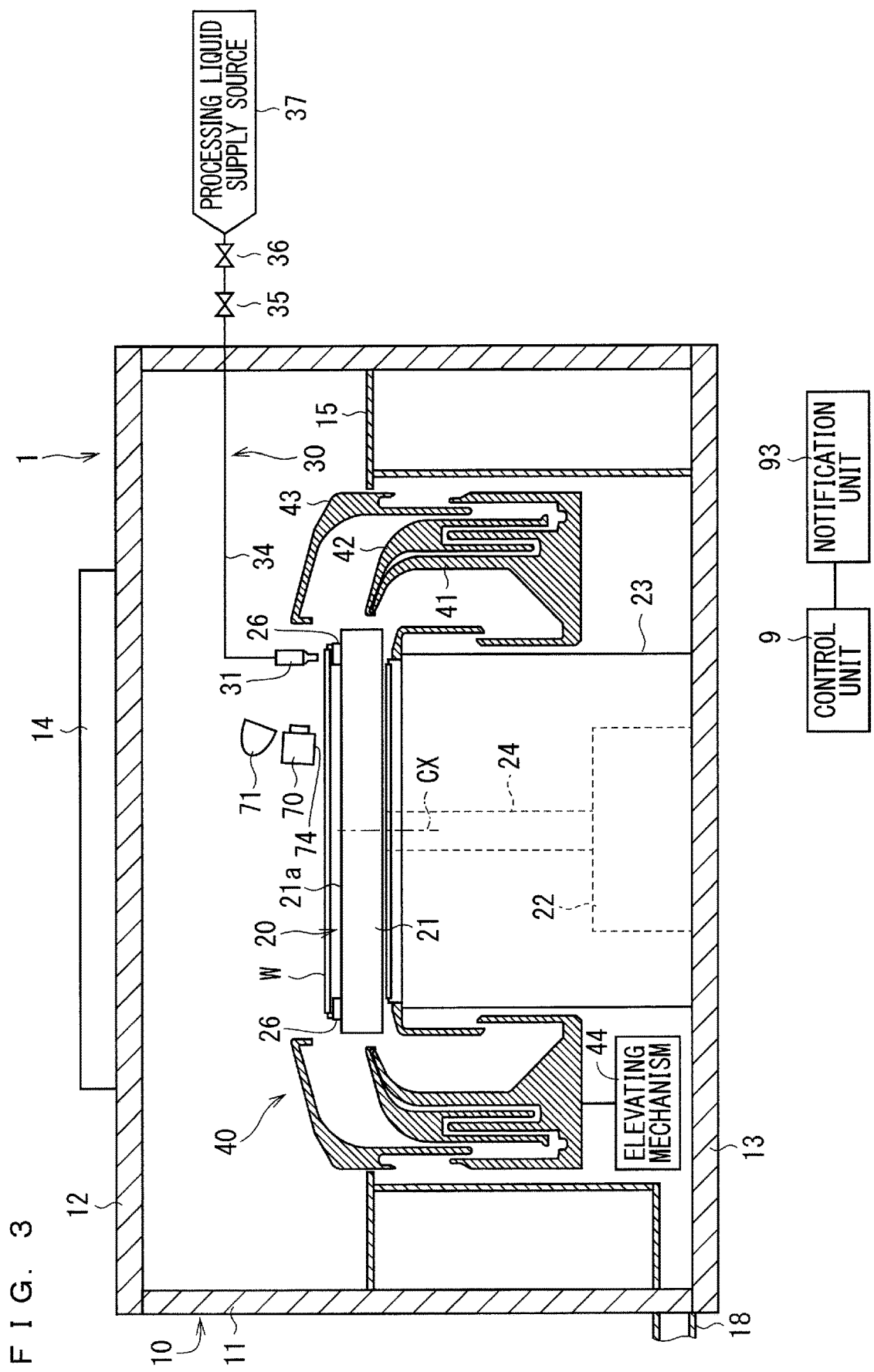
FIG. 3 is a cross-sectional view illustrating a schematic example of the configuration of the processing unit.

Next, the processing unit 1 will be described. Hereinafter, one of 12 of the processing units 1 mounted on the substrate processing apparatus 100 will be described, which similarly applies to the other ones of the processing units 1. FIG. 2 is a plan view of the processing unit 1. Further, FIG. 3 is a vertical cross-sectional view of the processing unit 1.

The processing unit 1 includes, as main elements in a chamber 10, a substrate holder 20 that holds the substrate W in a horizontal posture (a posture in which the normal line of the substrate W is along the vertical direction), three processing liquid supply units 30, 60, and 65 for supplying processing liquid to an upper surface of the substrate W held by the substrate holder 20, a processing cup (cup member) 40 surrounding a periphery of the substrate holder 20, and a camera 70. Further, around the processing cup 40 in the chamber 10, a partition plate 15 that vertically partitions an inner space of the chamber 10 is provided. Further, the processing unit 1 is provided with a control unit 9 and a notification unit 93.

<Chamber>

The chamber 10 includes a side wall 11 along the vertical direction, a ceiling wall 12 that blocks an upper side of a space surrounded by the side wall 11, and a floor wall 13 that blocks a lower side. The space surrounded by the side wall 11, the ceiling wall 12, and the floor wall 13 is a processing space for the substrate W. Further, a part of the side wall 11 of the chamber 10 is provided with a carry-in/out port through which a main conveyance robot 103 carries in and out the substrate W into and from the chamber 10 and a shutter for opening and closing the carry-in/out port (both of which are not shown).

A fan filter unit (FFU) 14 for further purifying the air in a clean room in which the substrate processing apparatus 100 is installed and supplying the air to the processing space in the chamber 10 is attached to the ceiling wall 12 of the chamber 10. The fan filter unit 14 includes a fan and a filter (for example, a HEPA filter) for taking in the air in the clean room and sending the air into the chamber 10, and forms a downflow of clean air in the processing space in the chamber 10. In order to uniformly disperse the clean air supplied from the fan filter unit 14, a punching plate provided with a large number of blowout holes may be provided directly under the ceiling wall 12.

<Substrate Holder>

The substrate holder 20 is, for example, a spin chuck. The substrate holder 20 includes a disk-shaped spin base 21 fixed in a horizontal posture to the upper end of a rotating shaft 24 extending along the vertical direction. A spin motor 22 for rotating the rotating shaft 24 is provided below the spin base 21. The spin motor 22 rotates the spin base 21 in a horizontal plane via the rotating shaft 24. Further, a tubular cover member 23 is provided so as to surround the spin motor 22 and the rotating shaft 24.

The outer diameter of the disk-shaped spin base 21 is slightly larger than the diameter of the circular substrate W held by the substrate holder 20. Therefore, the spin base 21 has a holding surface 21a facing the entire lower surface of the substrate W to be held.

A plurality (four in the present embodiment) of chuck pins 26 are erected on a peripheral end portion of the holding surface 21a of the spin base 21. A plurality of the chuck pins 26 are arranged at equal intervals (at 90° intervals in the case of four of the chuck pins 26 as in the present embodiment) along the circumference corresponding to the outer peripheral circle of the circular substrate W. A plurality of the chuck pins 26 are driven in conjunction with each other by a link mechanism (not shown) housed in the spin base 21. The substrate holder 20 can hold the substrate W in a horizontal posture close to the holding surface 21a above the spin base 21 (See FIG. 3) by causing each of a plurality of the chuck pins 26 to abut on the outer peripheral end of the substrate W to grip the substrate W, and can release the gripping by separating each of a plurality of the chuck pins 26 from the outer peripheral end of the substrate W.

As the spin motor 22 rotates the rotating shaft 24 in a state where the substrate holder 20 holds the substrate W by gripping with a plurality of the chuck pins 26, the substrate W can be rotated around a rotation axis CX along the vertical direction passing through the center of the substrate W. Here, it is assumed that the substrate holder 20 rotates in the counterclockwise direction in FIG. 2.

<Processing Liquid Supply Unit>

The processing liquid supply unit 30 includes a discharge nozzle 31, a fixing member 32, and a moving mechanism 33. The fixing member 32 is a member that fixes the discharge nozzle 31, and includes, for example, a nozzle arm 321 and a nozzle base 322. The discharge nozzle 31 is attached to the tip of the nozzle arm 321. The base end side of the nozzle arm 321 is fixedly connected to the nozzle base 322. The moving mechanism 33 moves the discharge nozzle 31 by displacing the fixing member 32. For example, the moving mechanism 33 is a motor that rotates the nozzle base 322 around an axis along the vertical direction. As the nozzle base 322 rotates, the discharge nozzle 31 moves in an arc along the horizontal direction between a processing position above an end portion of the substrate W and a standby position on the outer side than the processing cup 40, as shown by an arrow AR34 in FIG. 2.

The processing liquid supply unit 30 may include a plurality of the discharge nozzles 31. In the examples of FIGS. 2 and 3, three of the discharge nozzles 31 are shown as the discharge nozzles 31. The three discharge nozzles 31 are fixed to the nozzle base 322 with the nozzle arm 321 interposed between them. Therefore, the three discharge nozzles 31 move in synchronization with each other. The three discharge nozzles 31 are provided at positions arranged along the circumferential direction of the substrate W at the processing position. The distance in the circumferential direction between the three discharge nozzles 31 is, for example, about 10 and several [mm].

As exemplified in FIG. 3, the discharge nozzle 31 is connected to a processing liquid supply source 37 with a pipe 34 interposed between them. An on-off valve 35 is provided in the pipe 34. A discharge port (not shown) is formed on the lower surface of the tip of the discharge nozzle 31. When the on-off valve 35 is opened, the processing liquid from the processing liquid supply source 37 flows inside the pipe 34 and is discharged from the discharge port of the discharge nozzle 31. The processing liquid discharged in a state where the discharge nozzle 31 is stopped at the processing position lands on an end portion of the upper surface of the substrate W held by the substrate holder 20. As the substrate W rotates, the processing liquid from the discharge nozzle 31 is supplied to the entire region of the peripheral end portion of the substrate W, and an unnecessary substance in the peripheral end portion is removed (bevel processing).

A suck back valve 36 may be provided in the pipe 34. The suck back valve 36 sucks in the processing liquid in the pipe 34 when the discharge of the processing liquid is stopped, so that the processing liquid is drawn from the tip of the discharge nozzle 31. In this manner, when the discharge is stopped, the processing liquid is less likely to drop from the tip of the discharge nozzle 31 as a relatively large mass (droplet).

In a case where a plurality of the discharge nozzles 31 are provided, the discharge nozzles 31 may be connected to different ones of the processing liquid supply sources 37. That is, the processing liquid supply unit 30 may be configured to supply a plurality of types of the processing liquid. Alternatively, at least two of a plurality of the discharge nozzles 31 may supply the same processing liquid.

Further, the processing unit 1 of the present embodiment is provided with two of the processing liquid supply units 60 and 65 in addition to the processing liquid supply unit 30 described above. The processing liquid supply units 60 and 65 of the present embodiment have a similar configuration to that of the processing liquid supply unit 30 described above. That is, the processing liquid supply unit 60 has a discharge nozzle 61, a fixing member 62, and a moving mechanism 63. Like the fixing member 32, the fixing member 62 has a nozzle arm 621 and a nozzle base 622. The discharge nozzle 61 is attached to the tip of the nozzle arm 621, and the nozzle base 622 is connected to the base end of the nozzle arm 621. The moving mechanism 63 is, for example, a motor, and, by rotating the nozzle base 622, moves the discharge nozzle 61 in an arc between the processing position above the end portion of the substrate W and the standby position on the outer side than the processing cup 40 as shown by an arrow AR64. The discharge nozzle 61 also supplies the processing liquid to the end portion of the substrate W. As the substrate W rotates, the processing liquid from the discharge nozzle 61 is supplied to the entire region of the peripheral end portion of the substrate W, and an unnecessary substance in the peripheral end portion is removed (bevel processing).

The processing liquid supply unit 65 has a discharge nozzle 66, a fixing member 67, and a moving mechanism 68. The fixing member 67 has a nozzle arm 671 and a nozzle base 672. The discharge nozzle 66 is attached to the tip of the nozzle arm 671, and the nozzle base 672 is connected to the base end of the nozzle arm 671. The moving mechanism 68 is, for example, a motor, and, by rotating the nozzle base 672, moves the discharge nozzle 66 in an arc between the processing position above substantially the center of the substrate W and the standby position on the outer side than the processing cup 40 as shown by an arrow AR69. The discharge nozzle 61 supplies the processing liquid to substantially the center of the substrate W. As the substrate W rotates, the processing liquid from the discharge nozzle 66 spreads from the center of the substrate W and is scattered from the peripheral edge of the substrate W to the outside. In this manner, the processing liquid can be allowed to act on the entire upper surface of the substrate W.

Each of the processing liquid supply units 60 and 65 may also be configured to supply a plurality of types of the processing liquid. Alternatively, each of the processing liquid supply units 60 and 65 may be configured to supply a single processing liquid.

The processing liquid supply units 60 and 65 discharge the processing liquid onto the upper surface of the substrate W held by the substrate holder 20 in a state where the respective discharge nozzles 61 and 66 are located at the processing positions. Note that at least one of the processing liquid supply units 60 and 65 may be a two fluid nozzle that mixes a cleaning solution such as pure water and pressurized gas to generate a droplet, and injects a mixed fluid of the droplet and gas onto the substrate W. Further, the number of the processing liquid supply units provided in the processing unit 1 is not limited to three, and only needs to be one or more. Each of the discharge nozzles of the processing liquid supply units 60 and 65 is also connected to the processing liquid supply source with a pipe interposed between them like the processing liquid supply unit 30, an on-off valve is provided in the pipe, and a suck back valve may be further provided. Hereinafter, the bevel processing using the processing liquid supply unit 30 will be described as a representative.

<Processing Cup>

The processing cup 40 is provided so as to surround the substrate holder 20. The processing cup 40 includes an inner cup 41, a middle cup 42, and an outer cup 43. The inner cup 41, the middle cup 42, and the outer cup 43 are provided so as to be able to move up and down. Specifically, the processing unit 1 is provided with an elevating mechanism 44, and the elevating mechanism 44 can move up and down the inner cup 41, the middle cup 42, and the outer cup 43 individually. The elevating mechanism 44 has, for example, a ball screw mechanism.

When the inner cup 41, the middle cup 42, and the outer cup 43 are in a state of being moved up, the upper end of the processing cup 40 (here, the upper end of the outer cup 43) is located above the upper surface of the substrate W. Hereinafter, the height position of the upper end of the outer cup 43 in a state where the outer cup 43 is moved up is also referred to as the upper end position of the processing cup 40. The distance in the vertical direction between the upper end position of the processing cup 40 and the substrate W may be set to, for example, about 2 [mm] to about 10 and several [mm].

In a state where the inner cup 41, the middle cup 42, and the outer cup 43 are moved up, the processing liquid scattered from the peripheral edge of the substrate W hits the inner peripheral surface of the inner cup 41 and drops. The dropped processing liquid is appropriately collected by a first collection mechanism (not shown). In a state where the inner cup 41 is moved down and the middle cup 42 and the outer cup 43 are moved up, the processing liquid scattered from the peripheral edge of the substrate W hits the inner peripheral surface of the middle cup 42 and drops. The dropped processing liquid is appropriately collected by a second collection mechanism (not shown). In a state where the inner cup 41 and the middle cup 42 are moved down and the outer cup 43 is moved up, the processing liquid scattered from the peripheral edge of the substrate W hits the inner peripheral surface of the outer cup 43 and drops. The dropped processing liquid is appropriately collected by a third collection mechanism (not shown). According to this, different processing liquids can be appropriately collected.

Hereinafter, the state in which the outer cup 43 is moved up will be described as a state in which the processing cup 40 is moved up. That is, the state in which the processing cup 40 is moved up includes the state where all the inner cup 41, the middle cup 42, and the outer cup 43 are moved up, the state where only the middle cup 42 and the outer cup 43 are moved up, and the state where only the outer cup 43 is moved up.

<Partition Plate>

The partition plate 15 is provided so as to vertically partition the inner space of the chamber 10 around the processing cup 40. The partition plate 15 may be a single plate-shaped member surrounding the processing cup 40, or may be a combination of a plurality of plate-shaped members. Further, on the partition plate 15, a through hole penetrating in the thickness direction or a notch may be formed. In the present embodiment, a through hole (not shown) through which to allow a support shaft for supporting the nozzle bases 322, 622, and 672 of the processing liquid supply units 30, 60, and 65 to pass is formed.

The outer peripheral end of the partition plate 15 is connected to the side wall 11 of the chamber 10. Further, an edge portion surrounding the processing cup 40 of the partition plate 15 is formed so as to have a circular shape having a diameter larger than the outer diameter of the outer cup 43. Therefore, the partition plate 15 does not interfere with moving up and down of the outer cup 43.

Further, an exhaust duct 18 is provided on a part of the side wall 11 of the chamber 10 in the vicinity of the floor wall 13. The exhaust duct 18 communicates with and is connected to an exhaust mechanism (not shown). Of the clean air supplied from the fan filter unit 14 and flowing down in the chamber 10, the air that has passed between the processing cup 40 and the partition plate 15 is discharged from the exhaust duct 18 to the outside of the apparatus.

<Camera>

The camera 70 is installed in the chamber 10 and above the partition plate 15. The camera 70 includes, for example, an image sensor (for example, a charge coupled device (CCD)) and an optical system such as an electronic shutter and a lens. The camera 70 can image an imaging region described below. That is, the imaging region is a region viewed from an imaging position above the substrate W, and is a region including the tip of the discharge nozzle 31 at the processing position and substantially liquid-columnar processing liquid that is discharged from the tip to the end portion of the substrate W (see also FIG. 3).

FIG. 4 is a diagram schematically illustrating an example of image data (hereinafter referred to as a captured image) IM1 acquired by the camera 70. In the example of FIG. 4, the captured image IM1 includes the tips of three of the discharge nozzles 31. The captured image IM1 includes substantially liquid-columnar processing liquid Lq1 discharged from the discharge nozzle 31 located at the center among the three discharge nozzles 31. The substantially liquid-columnar processing liquid Lq1 referred to here is the processing liquid Lq1 that flows down from the tip of the discharge nozzle 31 toward the upper surface of the substrate W. The camera 70 outputs the captured image IM1 to the control unit 9.

As exemplified in FIG. 2, the camera 70 is preferably provided so as to be movable. In the example of FIG. 2, the camera 70 is fixed to the fixing member 62 of the processing liquid supply unit 60. As a more specific example, a camera holder 73 that holds the camera 70 is provided, and the camera holder 73 is connected to the nozzle arm 621 of the fixing member 62. For example, the camera holder 73 is fixed to the tip portion of the nozzle arm 621 by a fastening member (for example, a screw) on the base end side of the camera holder 73, and the camera 70 is fixed and held by the fastening member on the tip side. The camera holder 73 is formed of, for example, metal (for example, stainless steel) or the like. The moving mechanism 63 displaces the fixing member 62 to move the camera 70 to an imaging position above the substrate W.

Specifically, the moving mechanism 63 can reciprocate the camera 70 between the imaging position above the substrate W and the standby position on the outer side than the processing cup 40 by rotating the nozzle base 622.

In the example of FIG. 2, the standby position of the discharge nozzle 31 is at a position shifted by approximately 90 degrees in the clockwise direction from the standby position of the camera 70. The discharge nozzle 31 and the camera 70 move toward each other from their standby positions and stop at the processing position and the imaging position, respectively. At the imaging position, the camera 70 is held by the camera holder 73 in a posture capable of imaging the imaging region including the tip of the discharge nozzle 31 and the substantially liquid-columnar processing liquid Lq1 discharged from the tip. In the example of FIG. 2, the camera holder 73 projects obliquely in the clockwise direction with respect to the nozzle arm 621, and holds the camera 70 on the tip side of the camera holder 73.

Here, an example of a positional relationship between the camera 70 and the discharge nozzle 31 in a state where the discharge nozzle 31 stops at the processing position and the camera 70 stops at the imaging position will be described. Hereinafter, the positional relationship will be described using the discharge nozzle 31 located at the center of the three discharge nozzles 31.

In the example of FIG. 2, the camera 70 is located on the center side of the substrate W with respect to the discharge nozzle 31 in a plan view. That is, the radial position of the camera 70 with respect to the substrate W is located closer to the center of the substrate W than the radial position of the discharge nozzle 31.

Further, in the example of FIG. 2, the camera 70 images the tips of the three discharge nozzles 31 from the imaging direction closer to the circumferential direction than the radial direction of the substrate W in a plan view. That is, the position of the camera 70 in the circumferential direction with respect to the substrate W is shifted to one side with respect to the position of the discharge nozzle 31 in the circumferential direction. Furthermore, in other words, in a plan view, an angle θ1 (0<θ1<90) formed by a virtual straight line L1 connecting the center of the substrate W and the discharge nozzle 31 and the optical axis of the camera 70 is larger than an angle θ2 (0<θ2<90) formed by a virtual straight line L2 orthogonal to the straight line L1 and the optical axis of the camera 70. According to this, in the captured image IM1, it is possible to easily view the radial position of a liquid landing position on the substrate W of the processing liquid Lq1. However, if the angle θ2 is too small, the three discharge nozzles 31 may be arranged side by side in the depth direction and overlap with each other when viewed from the imaging position. In this case, since it is difficult to include all the three discharge nozzles 31 in the captured image IM1, it is preferable to set the angle θ2 so that the three discharge nozzles 31 are appropriately shifted in the lateral direction when viewed from the imaging position.

Further, when the camera 70 images the imaging region from the imaging direction closer to the circumferential direction, the three discharge nozzles 31 are shifted from each other in the depth direction when viewed from the imaging position. The distance in the depth direction between the three discharge nozzles 31 is, for example, about several [mm] to 10 and several [mm]. The depth of field of the camera 70 is set to be large enough to make the contours of the three discharge nozzles 31 clear. The distance between the camera 70 and the discharge nozzle 31 is, for example, about 100 [mm].

In the example of FIG. 2, the camera 70 is located on the upstream side in the rotation direction of the substrate holder 20 with respect to the discharge nozzle 31. On the upstream side with respect to the discharge nozzle 31, the amount of the processing liquid Lq1 on the peripheral end portion of the substrate W may be smaller than that on the downstream side. This is because the processing liquid Lq1 can be scattered outward from the peripheral edge of the substrate W as the substrate W rotates. Therefore, if the camera 70 is located on the upstream side with respect to the discharge nozzle 31, it is unlikely that the processing liquid Lq1 will be attached to the camera 70 or a vaporization component of the processing liquid Lq1 will affect the camera 70. That is, it is preferable that the camera 70 be located on the upstream side with respect to the discharge nozzle 31 from the viewpoint of protecting the camera 70.

When the discharge nozzle 31 discharges the processing liquid Lq1, the processing cup 40 is in a state of being moved up. This is because the processing cup 40 catches the processing liquid Lq1 scattered from the peripheral edge of the substrate W. In this state, the tip (discharge port) of the discharge nozzle 31 is at a position lower than the upper end position of the processing cup 40. For example, the distance in the vertical direction between the upper end position of the processing cup 40 and the upper surface of the substrate W is set to about 2 [mm] to about 10 and several [mm], and the distance between the discharge nozzle 31 and the substrate W is set to about 2 [mm] or less (for example, about 1 [mm]).

Here, for comparison, a case where the imaging position by the camera 70 is set on the outer side than the processing cup 40 will be described. For example, the imaging position is set on the side closer to the discharge nozzle 31 in the space on the outer side than the processing cup 40 (the upper right region in the chamber 10 of FIG. 3). Since the upper end position of the processing cup 40 is higher than the tip of the discharge nozzle 31, the processing cup 40 may interfere with imaging. That is, even if an attempt is made to image the substantially liquid-columnar processing liquid Lq1 from the imaging position on the outer side than the processing cup 40, the processing liquid Lq1 may be hidden by the processing cup 40. If the imaging position is set to a higher position in order to avoid the processing cup 40, the discharge nozzle 31 will be imaged from diagonally above. Since the distance between the tip of the discharge nozzle 31 and the substrate W is small, when an attempt is made to image the substantially liquid-columnar processing liquid Lq1 from diagonally above, the processing liquid Lq1 may be hidden by the discharge nozzle 31 this time.

In view of the above, setting the imaging position on the opposite side to the discharge nozzle 31 with respect to the center of the substrate W in the space on the outer side than the processing cup 40 (the upper left region in the chamber 10 of FIG. 3) can also be considered. In this manner, it may be possible to image the substantially liquid-columnar processing liquid Lq1 discharged from the discharge nozzle 31. However, since the distance between the tip of the discharge nozzle 31 and the imaging position of the camera 70 becomes large, the high-resolution camera 70 or the telephoto camera 70 is required.

On the other hand, in the present embodiment, since the imaging position is above the substrate W, it is easy to bring the imaging position closer to the upper surface of the substrate W in the height direction, and the optical axis of the camera 70 can be easily aligned with the horizontal direction. Therefore, the camera 70 can image the substantially liquid-columnar processing liquid Lq1 discharged from the discharge nozzle 31 without being hidden by the processing cup 40 and the discharge nozzle 31. The angle formed by the optical axis of the camera 70 and the horizontal plane may be set to, for example, about 10 or several [degrees] or less.

Further, it is also possible to bring the camera 70 closer to the discharge nozzle 31 in a plan view. Therefore, it is possible to employ a cheaper camera having a lower resolution or not requiring a telephoto lens. The size of such a camera is small, which is preferable. In the example of FIG. 4, since the distance between the camera 70 and the discharge nozzle 31 is small, the captured image IM1 includes only a part of the peripheral edge of the substrate W.

Here, an example of the imaging position in the height direction of the camera 70 will be described. The imaging position of the camera 70 may be set so that the lower end of the light receiving surface by the image sensor of the camera 70 is the same as the upper end position of the processing cup 40 or lower than the upper end position. For example, the distance between the camera 70 and the upper surface of the substrate W can be set to about 1 [mm] to 5 [mm]. In this manner, the camera 70 can be brought closer to the upper surface of the substrate W, and the optical axis of the camera 70 can be aligned more with the horizontal direction.

Alternatively, the imaging position of the camera 70 may be set so that the lower end of a housing of the camera 70 is at the same position as the upper end position of the processing cup 40 or at a position lower than the upper end position.

Figure 5:
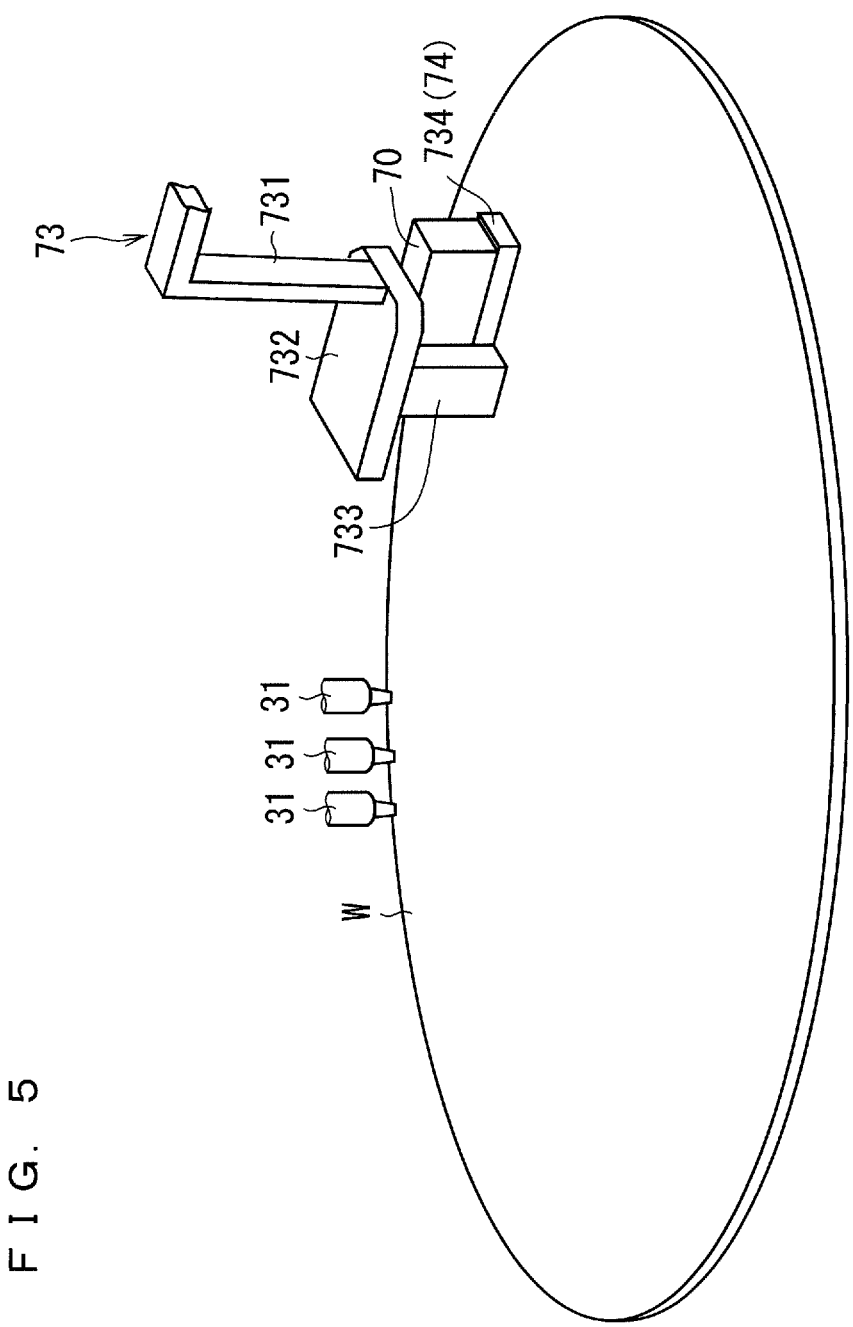
FIG. 5 is a perspective view schematically illustrating an example of a configuration of the camera and a camera holder.

Further, there may be a case where the camera holder 73 supports the lower surface of the camera 70. FIG. 5 is a perspective view schematically illustrating an example of the camera 70 and the camera holder 73, and FIG. 5 also illustrates the substrate W and the discharge nozzle 31. In the example of FIG. 5, the camera holder 73 has an L-shaped connecting member 731, an upper surface member 732 located on the upper surface side of the camera 70, a side surface member 733 located on the side surface side of the camera 70, and a lower surface member 734 located on the lower surface side of the camera 70. The connecting member 731 has a first rod-shaped member extending in the horizontal direction from the nozzle arm 621 and a second rod-shaped member extending vertically downward from the tip of the first rod-shaped member. The tip of the second rod-shaped member is connected to the upper surface member 732. In the example of FIG. 5, the upper surface member 732, the side surface member 733, and the lower surface member 734 have a plate-like shape. The upper surface member 732 and the lower surface member 734 are arranged in a posture in which the thickness direction of the members is along the vertical direction, and the side surface member 733 is arranged in a posture in which the thickness direction of the member is along the horizontal direction. The side member 733 connects the upper surface member 732 and the lower surface member 734. The lower surface member 734 also functions as a support member that supports the camera 70.

In such a structure, the imaging position of the camera 70 may be set so that the lower end of the lower surface member 734 is the same as the upper end position of the processing cup 40 or lower than the upper end position. In this manner as well, the camera 70 can be brought closer to the upper surface of the substrate W, and the optical axis of the camera 70 can be aligned more with the horizontal direction.

<Illumination Unit>

As shown in FIG. 3, an illumination unit 71 is provided in the chamber 10 and above the partition plate 15. The illumination unit 71 includes a light source such as a light emitting diode (LED). The wavelength of the light emitted by the illumination unit 71 is not particularly limited, and, for example, visible light or near-infrared light can be employed. In the example of FIG. 3, the illumination unit 71 is arranged above the camera 70. For example, the illumination unit 71 is arranged at a position overlapping the camera 70 in a plan view (see FIG. 2). The illumination unit 71 may be held by the camera holder 73. For example, the illumination unit 71 may be fixed to the upper surface of the upper surface member 732 of the camera holder 73. Since the inside of the chamber 10 is usually a dark room, the illumination unit 71 irradiates the imaging region with light when the camera 70 performs imaging.

<Control Unit>

The control unit 9 controls various configurations of the substrate processing apparatus 100 to proceed with processing on the substrate W. Further, the control unit 9 performs image processing on the captured image IM1 acquired by the camera 70. Since the camera 70 images the tip of the discharge nozzle 31 from the imaging position above the substrate W, the substantially liquid-columnar processing liquid Lq1 discharged from the discharge nozzle 31 is appropriately included in the captured image IM1 acquired by the camera 70. The control unit 9 monitors a discharge state of the processing liquid Lq1 discharged from the discharge nozzle 31 by image processing on the captured image IM1 (bevel monitoring). An example of the monitoring processing will be described in detail later.

The configuration as hardware of the control unit 9 is similar to that of a general computer. That is, the control unit 9 is configured by including a CPU that performs various types of arithmetic processing, a ROM that is a read-only memory that stores a basic program, a RAM that is a read/write memory that stores various types of information, a magnetic disk that stores control software, data, and the like. When the CPU of the control unit 9 executes a predetermined processing program, each operation mechanism of the substrate processing apparatus 100 is controlled by the control unit 9, and the processing in the substrate processing apparatus 100 proceeds. Further, the CPU of the control unit 9 performs image processing by executing a predetermined processing program. Note that some or all of the functions of the control unit 9 may be realized by dedicated hardware.

<Notification Unit>

The notification unit 93 is, for example, a voice output unit (for example, a speaker) or a display. The notification unit 93 can perform various types of notification to the operator. For example, the voice output unit outputs a notification sound (buzzer or voice), or the display displays notification information, so that various types of notification can be performed to the operator. The notification of the notification unit 93 is controlled by the control unit 9.

<Operation of Control Unit>

Figure 6:
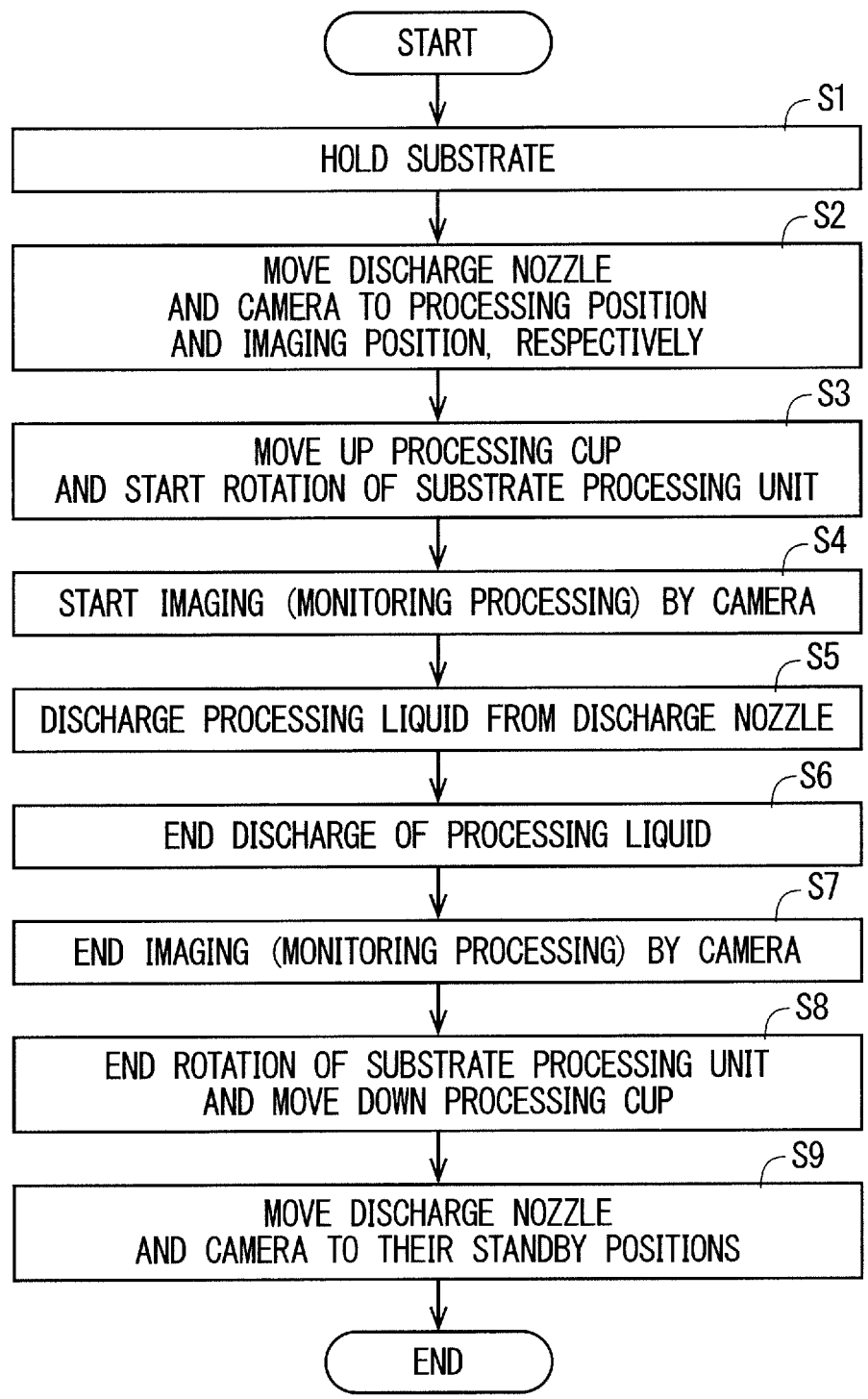
FIG. 6 is a flowchart showing an example of substrate processing.

FIG. 6 is a flowchart showing an example of substrate processing. First, in Step S1, the substrate W is conveyed onto the substrate holder 20 by the main conveyance robot 103. The substrate holder 20 holds the conveyed substrate W.

Next, in Step S2, the control unit 9 controls the moving mechanism 33 to move the discharge nozzle 31 to the processing position, and controls the moving mechanism 63 to move the camera 70 to the imaging position. Next, in Step S3, the control unit 9 controls the elevating mechanism 44 to move up the processing cup 40, and controls the spin motor 22 to rotate the spin base 21. The rotation speed of the spin base 21 is set to, for example, about 1000 [rpm] or more.

Next, in Step S4, the control unit 9 controls the camera 70 to start imaging. The camera 70 images the imaging region at a predetermined frame rate (for example, 60 frames/second), and sequentially outputs the acquired captured image IM1 to the control unit 9. The control unit 9 monitors the discharge state of the processing liquid Lq1 based on the image processing for the captured image IM1 as described in detail later.

Next, in Step S5, the control unit 9 starts discharging the processing liquid Lq1 from the discharge nozzle 31. Specifically, the control unit 9 outputs an open signal to the on-off valve 35. The on-off valve 35 performs opening operation to open the pipe 34 based on this open signal. In this manner, the processing liquid Lq1 from the processing liquid supply source 37 is discharged from the discharge nozzle 31 and lands on an end portion of the upper surface of the substrate W. The flow rate of the processing liquid Lq1 is set to, for example, several to several tens [ml/min]. This flow rate is smaller than the flow rate of the processing liquid when the entire surface of the substrate W is processed (for example, the flow rate of the processing liquid discharged from the discharge nozzle 66 of the processing liquid supply unit 65).

The processing liquid Lq1 is discharged to the end portion of the substrate W while the substrate W is rotated, so that the processing liquid Lq1 acts on the entire peripheral end portion of the substrate W. With the processing liquid Lq1, an unnecessary substance attached to the peripheral end portion of the substrate W can be removed (bevel processing). The processing liquid Lq1 according to the type of the unnecessary substance (for example, a film) may be sequentially discharged from the discharge ports of the three discharge nozzles 31. Note that the processing liquid may be discharged from at least two discharge ports of the three discharge nozzles 31 at the same time.

In this bevel processing, it is desirable to control the flow rate of the processing liquid Lq1 with high accuracy in order to appropriately remove an unnecessary substance attached to the peripheral end portion of the substrate W.

Further, a device is formed in a device region other than the peripheral end portion of the upper surface of the substrate W. It is not desirable that the processing liquid Lq1, which removes a film, enter the device region. This is because the processing liquid Lq1 may remove a necessary film in the device region. In contrast, it is necessary to remove an unnecessary film existing in the peripheral end portion. In order to satisfy this requirement, it is desirable to control the liquid landing position of the processing liquid Lq1 with high accuracy in the bevel processing. The required accuracy of the liquid landing position of the processing liquid Lq1 on the substrate W is, for example, about several tens (for example, 50) [μm].

Since the flow rate of the processing liquid Lq1 is small in the bevel processing, the processing liquid Lq1 is easily affected by the air flow accompanying the rotation of the substrate W or the surrounding static electricity, and the liquid landing position and the like may change.

The control unit 9 monitors the discharge state of the processing liquid Lq1 in the monitoring processing. The specific operation of the monitoring processing will be described in detail later.

When an end condition of the bevel processing is satisfied, the control unit 9 stops the discharge of the processing liquid Lq1 from the discharge nozzle 31 in Step S6. The end condition for the bevel processing is not particularly limited. For example, a condition that the elapsed time from Step S5 reaches a predetermined time can be employed. The control unit 9 outputs a close signal to the on-off valve 35 in response to the satisfaction of the end condition. The on-off valve 35 performs closing operation to close the pipe 34 based on this close signal. In this manner, the discharge of the processing liquid Lq1 ends. Note that, in a case where the suck back valve 36 is provided, the control unit 9 outputs a suction signal to the suck back valve 36.

After the discharge of the processing liquid Lq1 is stopped, a process of drying the substrate W may be appropriately performed. Next, in Step S7, the control unit 9 causes the camera 70 to finish imaging. That is, the monitoring processing is finished. Next, in Step S8, the control unit 9 controls the spin motor 22 to end the rotation of the spin base 21, and also controls the elevating mechanism 44 to move down the processing cup 40. Next, in Step S9, the control unit 9 controls the moving mechanism 33 and the moving mechanism 63 to move the discharge nozzle 31 and the camera 70 to their standby positions.

Figure 7:
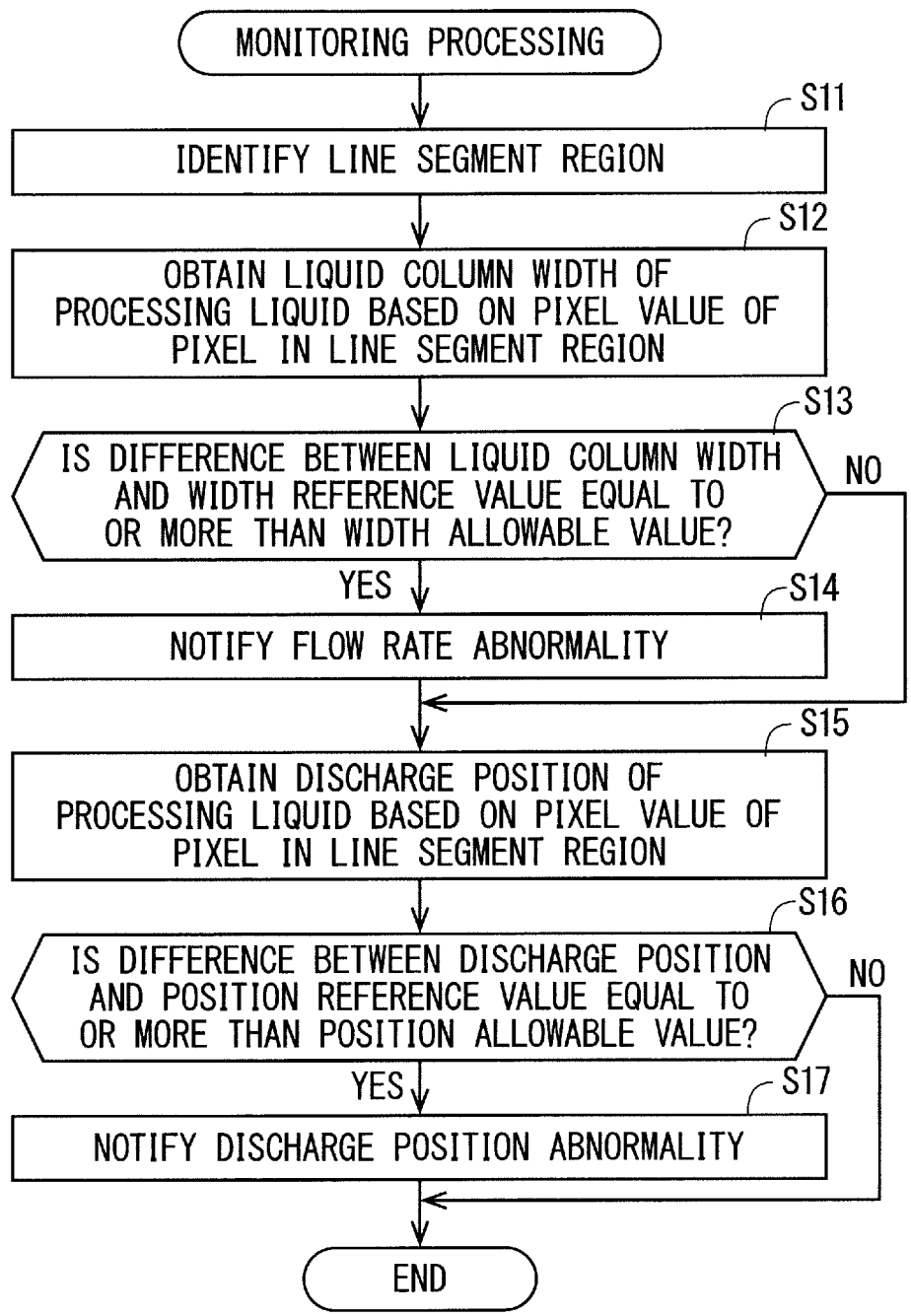
FIG. 7 is a flowchart showing an example of monitoring processing.

FIG. 7 is a flowchart showing an example of the operation of the monitoring processing. The processing flowchart shown in FIG. 7 is executed each time the captured image IM1 is input to the control unit 9. First, in Step S11, the control unit 9 identifies a line segment region R2 described below in the captured image IM1.

Figure 8:
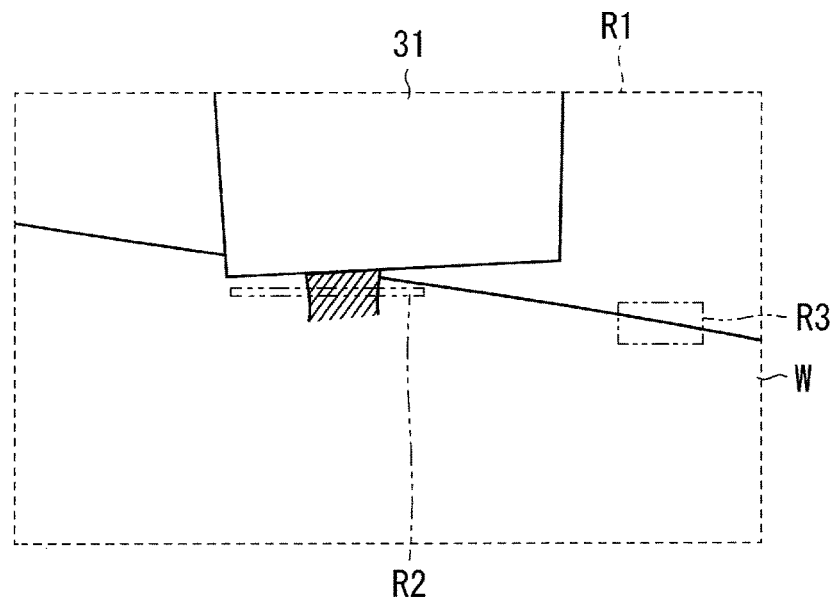
FIG. 8 is an enlarged view of a part of a captured image.

FIG. 8 is a diagram schematically illustrating an example of an enlarged view of the captured image IM1. In the example of FIG. 8, an enlarged view of a region R1 near the tip of one of the discharge nozzles 31 is shown. The line segment region R2 is a region immediately below the discharge nozzle 31 in the captured image IM1, and is a region including a part of the substantially liquid-columnar processing liquid Lq1 discharged from the discharge nozzle 31. The line segment region R2 is set at a position away from the discharge nozzle 31 in the captured image EVIL The line segment region R2 has an elongated shape that is long in the lateral direction. That is, the width in the vertical direction of the line segment region R2 is smaller than that in the lateral direction. More specifically, the width in the lateral direction of the line segment region R2 is larger than a liquid column width of the processing liquid Lq1 discharged from the discharge nozzle 31, and is set to, for example, three times or more a normal liquid column width. The position in the lateral direction of the line segment region R2 is set so that both ends in the width direction of the processing liquid Lq1 are included in the line segment region R2. The width in the vertical direction of the line segment region R2 is appropriately set, and, for example, the width may be a width corresponding to one pixel. Here, as an example, it is assumed that the width in the vertical direction of the line segment region R2 is a width corresponding to one pixel.

The line segment region R2 in the captured image IM1 is preset for the discharge nozzle 31. That is, a relative positional relationship between the discharge nozzle 31 and the line segment region R2 is preset. Information indicating this positional relationship may be stored in a storage medium of the control unit 9.

Since the relative position of the camera 70 with respect to the discharge nozzle 31 may change according to the accuracy of the moving mechanisms 33 and 63, the position of the discharge nozzle 31 in the captured image IM1 may also change. In view of the above, the control unit 9 preferably identifies the position of the discharge nozzle 31 in the captured image IM1 and identifies the line segment region R2 having a predetermined positional relationship with the identified discharge nozzle 31. In order for the position of the discharge nozzle 31 in the captured image IM1 to be identified, a reference image including an appearance of the tip of the discharge nozzle 31 is also stored in advance in the storage medium of the control unit 9. The control unit 9 identifies the position of the discharge nozzle 31 in the captured image IM1 by pattern matching based on the reference image, and the line segment region R2 is identified based on a predetermined relative positional relationship with respect to the identified discharge nozzle 31. In this manner, even if the position of the discharge nozzle 31 changes in the captured image IM1, the line segment region R2 can be appropriately identified according to the position of the discharge nozzle 31.

In the state where the discharge nozzle 31 discharges the processing liquid Lq1, the line segment region R2 includes a part of the substantially liquid-columnar processing liquid Lq1. Since the light emitted by the illumination unit 71 is reflected by the processing liquid Lq1 and received by the camera 70, a luminance value of a pixel reflecting the processing liquid Lq1 is higher than luminance values of the other pixels. Note that, in a case where the camera 70 is a grayscale monochrome camera, it can be said that a pixel value of a pixel indicates a luminance value. Here, as an example, it is assumed that the camera 70 is a monochrome camera.

Figure 9:
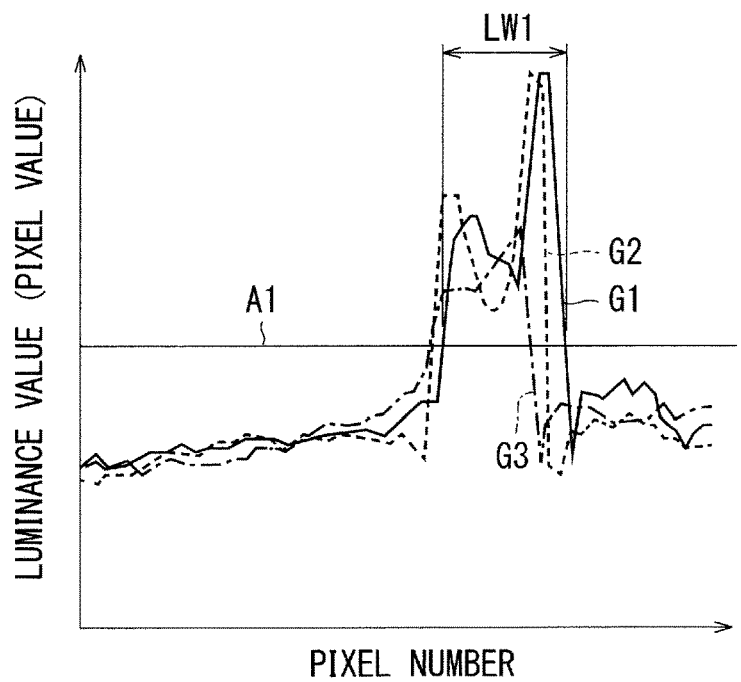
FIG. 9 is a graph showing an example of a luminance value in a line segment region.

FIG. 9 is a graph showing an example of the luminance value (here, the pixel value) of a pixel in the line segment region R2. The horizontal axis shows pixel numbers of pixels arranged in the lateral direction in the line segment region R2, and the vertical axis shows pixel values. In FIG. 9, three graphs G1 to G3 in which the flow rates of the processing liquid Lq1 are different are shown. The graphs G1 to G3 show graphs in a case where the flow rates of the processing liquid Lq1 are 18 [ml/min], 12 [ml/min], and 8 [ml/min], respectively.

Since the pixel value of the pixel reflecting the processing liquid Lq1 is larger than pixel values of the other pixels, the pixel value changes sharply at both ends in the width direction of the substantially liquid-columnar processing liquid Lq1. That is, it can be said that the region in which the pixel value of each pixel is larger than a reference value A1 in the line segment region R2 is a region corresponding to the processing liquid Lq1. This reference value A1 can be preset by simulation, experiment, or the like.

With reference to FIG. 7, in Step S12, the control unit 9 obtains the liquid column width of the processing liquid Lq1 based on the pixel values of the pixels in the line segment region R2. For example, the control unit 9 determines for each pixel whether or not the pixel value in the line segment region R2 is larger than the reference value A1. Then, the control unit 9 calculates the number LW1 of pixels between the pixels located at both ends among a plurality of pixels having a pixel value larger than the reference value A1, and calculates the liquid column width based on the number LW1 of pixels. With reference to FIG. 9, the larger the flow rate of the processing liquid Lq1 is, the larger the liquid column width of the processing liquid Lq1 becomes.

Next, in Step S13, the control unit 9 determines whether or not the difference (absolute value) between the calculated liquid column width and a width reference value is equal to or more than a predetermined width allowable value. That is, the control unit 9 determines whether or not the liquid column width is within an appropriate range. As the width reference value, a value indicating an appropriate liquid column width can be employed. For example, an average value of normal liquid column widths may be calculated based on a plurality of the captured images IM1 captured in a state where the processing liquid Lq1 is normally discharged, and the average value may be employed as the width reference value. The width allowable value is also preset. The width reference value and the width allowable value may be stored in the storage medium of the control unit 9, for example.

When the difference is equal to or more than the width allowable value, the control unit 9 causes the notification unit 93 to notify flow rate abnormality in Step S14, and then executes Step S15 (described later). In this manner, the operator can recognize that the flow rate abnormality has occurred. In contrast, when the difference is less than the allowable value, Step S15 is executed without execution of Step S14.

In Step S15, the control unit 9 identifies the discharge position of the processing liquid Lq1 based on the pixels in the line segment region R2. As the discharge position, for example, the center position in the width direction of the processing liquid Lq1 in the line segment region R2 can be employed.

In order to identify this discharge position, the control unit 9 first identifies the positions of both ends in the width direction of the processing liquid Lq1 in the line segment region R2 as described above. Specifically, the control unit 9 identifies the pixels located at both ends among a plurality of pixels having a pixel value larger than the reference value A1 as the positions at both ends in the width direction of the processing liquid Lq1. Then, the control unit 9 obtains the central position of the both ends as the discharge position of the processing liquid Lq1.

Next, in Step S15, the control unit 9 determines whether or not the difference (absolute value) between the discharge position of the processing liquid Lq1 and a position reference value is larger than a predetermined position allowable value. That is, the control unit 9 determines whether or not the discharge position of the processing liquid Lq1 is within an appropriate range. Since the discharge position of the processing liquid Lq1 reflects the liquid landing position of the processing liquid Lq1 on the substrate W, it can be said that the control unit 9 determines whether or not the liquid landing position is within an appropriate range. As the position reference value, a value indicating an appropriate discharge position can be employed. For example, an average value of normal discharge positions may be calculated based on a plurality of the captured images IM1 captured in a state where the processing liquid Lq1 is normally discharged, and the average value may be employed as the position reference value. The position allowable value is also preset. The position reference value and the position allowable value may be stored in the storage medium of the control unit 9, for example.

When the difference is equal to or more than the position allowable value, in Step S17, the control unit 9 causes the notification unit 93 to notify discharge position abnormality, and ends the processing. In this manner, the operator can recognize that the discharge position abnormality has occurred. In contrast, when the difference is smaller than the allowable value, the processing ends without execution of Step S17.

As described above, the control unit 9 can monitor the discharge state (the flow rate and the discharge position) of the processing liquid Lq1 discharged from the discharge nozzle 31.

Note that, in the above example, the control unit 9 monitors the central position in the width direction of the processing liquid Lq1 as the discharge position. However, the control unit 9 may monitor the positions at both ends in the width direction as the discharge position of the processing liquid Lq1. That is, the control unit 9 may determine whether or not the positions of one end and the other end in the width direction of the processing liquid Lq1 are appropriate. By calculation of the difference between the position of one end of the processing liquid Lq1 and its normal position and the difference between the position of the other end of the processing liquid Lq1 and its normal position, the discharge state of the processing liquid Lq1 can be determined more in detail.

Further, in the above example, the width in the vertical direction of the line segment region R2, which is set to the width of one pixel, may be the width of a plurality of pixels. In this case, pixel values of pixels arranged in the vertical direction may be integrated for each column, and the liquid column width and the discharge position of the processing liquid Lq1 may be obtained based on a plurality of integrated values in a plurality of the columns. According to this, the average value of the liquid column widths in the vertical direction of the processing liquid Lq1 can be obtained as the liquid column width, and similarly, the average value of the discharge positions in the vertical direction can be obtained as the discharge position.

Further, in the above example, the camera 70 is fixed to the fixing member 62 like the discharge nozzle 61. That is, the mechanism for moving the camera 70 is also used as the mechanism for moving the discharge nozzle 61. Therefore, the manufacturing cost and size can be reduced as compared with the case where a dedicated mechanism is provided for each.

<Fixing of Camera>

Figure 10:
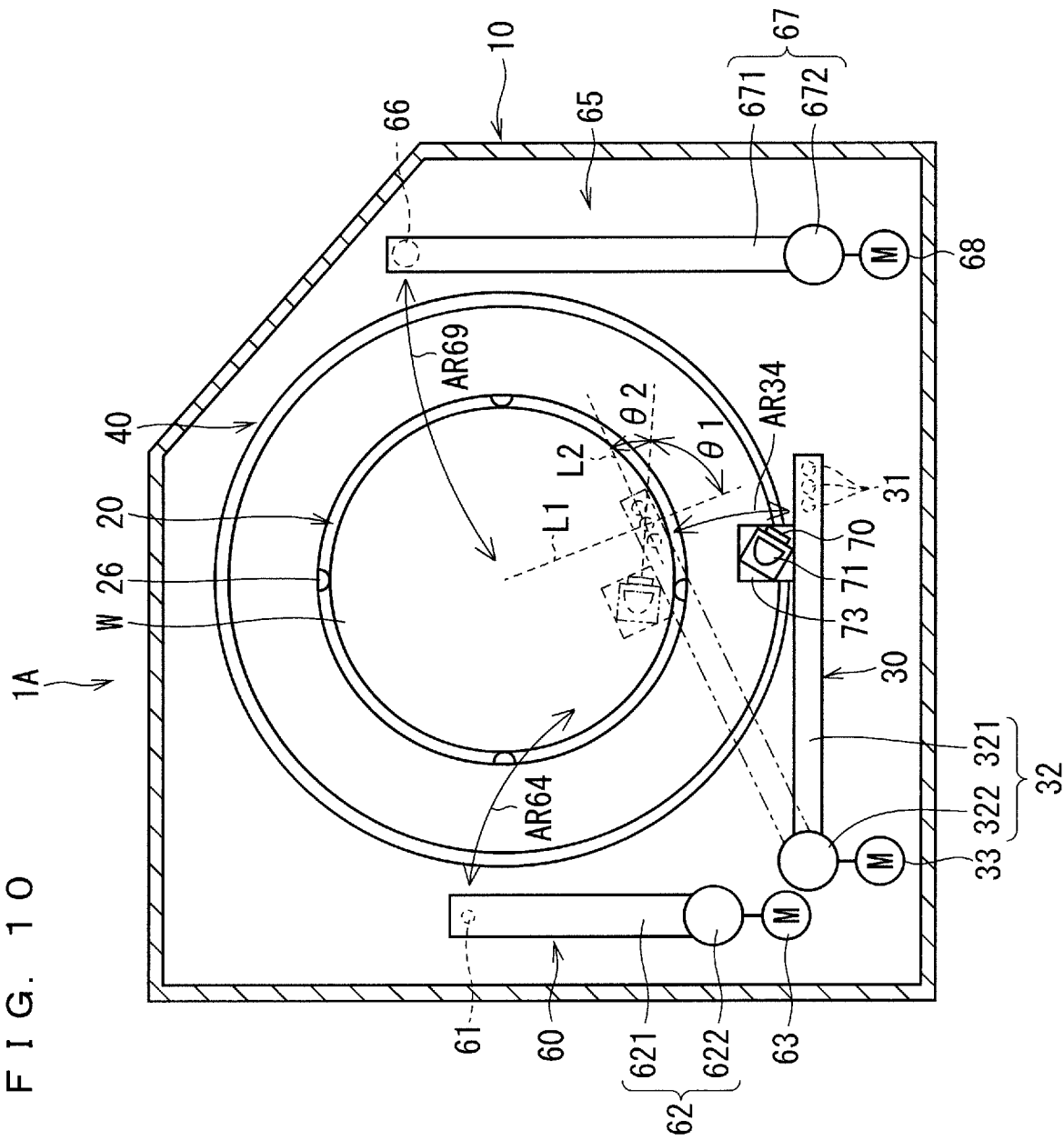
FIG. 10 is a plan view illustrating a schematic example of a configuration of a processing unit.

FIG. 10 is a plan view schematically illustrating an example of a configuration of a processing unit 1A. The processing unit 1A has a similar configuration to the processing unit 1 except for a target fixing the camera 70. In the processing unit 1A, the camera 70 is fixed to the fixing member 32 in the same manner as the discharge nozzle 31 to be imaged. More specifically, the camera holder 73 is connected to the nozzle arm 321 on the side of the nozzle arm 321. The camera holder 73 holds the camera 70. The camera 70 is fixed to the fixing member 32 with the camera holder 73 interposed between them. The camera 70 and the camera holder 73 are arranged on the counterclockwise direction side (that is, the side from the standby position of the discharge nozzle 31 toward the processing position) with respect to the nozzle arm 321. Further, the camera 70 is held by the camera holder 73 in a posture in which the tip of the discharge nozzle 31 and the processing liquid Lq1 discharged from the discharge nozzle 31 can be imaged.

By the moving mechanism 33 rotating the nozzle base 322, the discharge nozzle 31 and the camera 70 can be moved to each of the processing position and the imaging position, while their positional relationship is maintained. The positional relationship between the imaging position of the camera 70 and the processing position of the discharge nozzle 31 is similar to that of the processing unit 1.

Like the processing unit 1, the processing unit 1A also allows the camera 70 to appropriately image the substantially liquid-columnar processing liquid Lq1 discharged from the discharge nozzle 31.

Further, since the camera 70 is fixed to the same fixing member 32 as the discharge nozzle 31, the camera 70 can be positioned with respect to the discharge nozzle 31 with high accuracy. That is, in the processing unit 1, since the discharge nozzle 31 and the camera 70 are fixed to the different nozzle arms 321 and 621, a relatively large margin needs to be provided between the camera 70 and the nozzle arm 321 in view of the accuracy of the moving mechanisms 33 and 63. In contrast, in the processing unit 1A, since the discharge nozzle 31 and the camera 70 are fixed to the same nozzle arm 321, the margin between the camera 70 and the nozzle arm 321 can be set to be small. That is, the camera 70 can be brought closer to the nozzle arm 321. According to this, the camera 70 can image the discharge nozzle 31 from a direction closer to the circumferential direction. Therefore, it is easy to identify the discharge position in the radial direction of the processing liquid Lq1 in the captured image EVIL <Camera Protection>

In a case where the processing liquid Lq1 contains hydrofluoric acid, it is preferable that the lower surface of the housing of the camera 70 or the lower end surface of the lower surface member 734 of the camera holder 73 be made from a chemical resistant material. In short, it is preferable that a protective member 74 that protects the camera 70 be provided on the lower surface side of the camera 70. As the protective member 74, fluororesin such as polytetrafluoroethylene, chemical resistant resin such as vinyl chloride resin, or metal such as stainless steel, which has high chemical properties against hydrofluoric acid, can be employed.

According to this, the possibility that the camera 70 located above the substrate W is corroded by a vaporization component of the processing liquid Lq1 can be reduced. Therefore, the reliability of the camera 70 can be improved.

<Line Segment Region R2>

Figure 11:
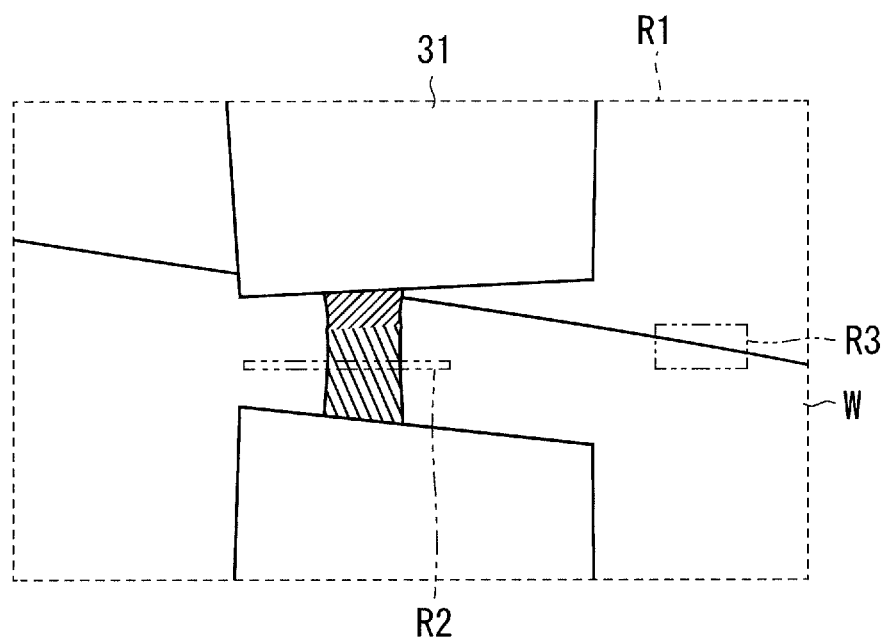
FIG. 11 is a diagram schematically illustrating an example of a captured image.

FIG. 11 is a diagram schematically showing another example of the region R1 of the captured image EVIL In the captured image IM1 exemplified in FIG. 11, the discharge nozzle 31 is included in the upper surface of the substrate W. This is because the light from the illumination unit 71 is reflected by the discharge nozzle 31 and then specularly reflected on the upper surface of the substrate W to be received by the light receiving surface of the camera 70. That is, the upper surface of the substrate W functions as a mirror, and the appearance of the discharge nozzle 31 is reflected on the upper surface.

In the captured image EVIL the line segment region R2 may be set so as to include a part of the substantially liquid-columnar processing liquid Lq1 reflected on the upper surface of the substrate W. That is, in the captured image EVIL the line segment region R2 may be set so as to cross the substantially liquid-columnar processing liquid Lq1 reflected on the upper surface of the substrate W.

The control unit 9 can identify the liquid column width and the discharge position of the processing liquid Lq1 in the line segment region R2 by the image processing similar to the image processing described above.

Moreover, in the present embodiment, since the optical axis of the camera 70 is formed more along the horizontal direction, the length in the vertical direction of the processing liquid Lq1 reflected on the upper surface of the substrate W in the captured image IM1 is larger than the length of the processing liquid Lq1 between the discharge nozzle 31 and the substrate W. According to this, it is easy to set the line segment region R2 so as to cross the processing liquid Lq1. Further, the width in the vertical direction of the line segment region R2 can be set to be larger.

Various patterns such as a metal pattern, a semiconductor pattern, an insulating layer pattern, and a resist pattern may be formed on the upper surface of the substrate W. Therefore, the processing liquid Lq1 reflected on the upper surface of the substrate W is affected by these patterns. In this manner, the contour of the processing liquid Lq1 may be blurred.

In view of the above, the exposure time of the camera 70 is preferably set to be equal to or larger than the rotation time required for one rotation of the substrate W. According to this, since the pattern of the substrate W in the captured image IM1 is averaged and uniformed, the contour of the processing liquid Lq1 in the captured image can be emphasized. According to this, it is possible to improve the accuracy of identifying the positions at both ends of the processing liquid Lq1, and the liquid column width and the discharge position can be obtained with higher accuracy.

Alternatively, the exposure time may be shorter than the rotation time. The control unit 9 may integrate or average a plurality of the captured images IM1 captured within a predetermined time longer than the rotation time to generate a processed image at predetermined time intervals. In the processed image at predetermined time intervals, the pattern on the upper surface of the substrate W is averaged and uniformed, so that the contour of the processing liquid Lq1 can be emphasized.

<Position of Discharge Nozzle 31>

The processing position of the discharge nozzle 31 may be controlled based on the captured image EVIL Hereinafter, a specific description will be made.

The processing position of the discharge nozzle 31 is a position separated from the peripheral edge of the substrate W by a predetermined width. In view of the above, the control unit 9 identifies the position of the peripheral edge of the substrate W in the captured image IM1 (hereinafter, referred to as the substrate peripheral position). First, the control unit 9 identifies a peripheral region R3 described below in the captured image EVIL The peripheral region R3 is a region including a part of the peripheral edge of the substrate W in the captured image EVIL In the example of FIG. 8, the peripheral region R3 has a rectangular shape. The position of the peripheral region R3 is preset according to the position of the discharge nozzle 31 as in the line segment region R2. That is, a relative positional relationship between the discharge nozzle 31 and the peripheral region R3 is preset. Information indicating this positional relationship may be stored in a storage medium of the control unit 9.

The control unit 9 identifies the position of the discharge nozzle 31 in the captured image IM1 by pattern matching, and identifies the peripheral region R3 based on the identified position of the discharge nozzle 31. Then, the control unit 9 identifies the substrate peripheral position of the substrate W in the peripheral region R3. For example, the control unit 9 identifies the peripheral edge of the substrate W based on image processing such as edge detection processing. In this manner, the substrate peripheral position of the substrate W with reference to the position of the discharge nozzle 31 can be identified.

The control unit 9 may determine the processing position of the discharge nozzle 31 based on the substrate peripheral position. For example, the captured image is acquired in advance when the discharge nozzle 31 is stopped at the correct processing position, the substrate peripheral position in the peripheral region R3 is obtained in advance in the captured image IM1, and the substrate peripheral position is stored in the storage medium of the control unit 9 in advance as a reference position.

The control unit 9 compares the identified substrate peripheral position with the reference position, and adjusts the position of the discharge nozzle 31 so that the difference is reduced. For example, when the substrate peripheral position is shifted in the left direction from the reference position in the captured image IM1, the control unit 9 controls the moving mechanism 33 to move the discharge nozzle 31 to the center side of the substrate W, and when the substrate peripheral position is shifted in the right direction from the reference position, the control unit 9 controls the moving mechanism 33 to move the discharge nozzle 31 to the peripheral edge side of the substrate W. In this manner, the discharge nozzle 31 can be moved to a position that is a central portion of the substrate W by a predetermined width from the substrate peripheral position.

<Liquid Landing Position on the Substrate>

In the above example, the control unit 9 obtains the discharge position of the processing liquid Lq1 based on a pixel in the line segment region R2 with reference to the position of the discharge nozzle 31. That is, the discharge position with reference to the position of the discharge nozzle 31 is obtained so that the discharge position is monitored. However, the control unit 9 may monitor the discharge position of the processing liquid Lq1 with reference to the position of the peripheral edge of the substrate W.

As described above, the control unit 9 can identify the discharge position and the substrate peripheral position with reference to the position of the discharge nozzle 31. Therefore, the control unit 9 can identify the discharge position (and thus the liquid landing position) with reference to the substrate peripheral position based on these positions. For example, table information as a reference is generated in advance by an experiment or the like. Specifically, the processing position of the discharge nozzle 31 is appropriately changed by the control of the control unit 9 in advance, and each time, the processing liquid Lq1 is discharged from the discharge nozzle 31 and the captured image IM1 is acquired. Then, at each processing position of the discharge nozzle 31, the distance between the liquid landing position of the processing liquid Lq1 and the peripheral edge of the substrate W is measured, and a positional relationship between a substrate end position and the discharge position in the captured image IM1 at that time is identified. Then, the measured distance and the identified positional relationship are associated with each other, and these are stored in advance in the storage medium of the control unit 9 as table information.

The control unit 9 identifies a positional relationship between the substrate end position and the discharge position in the captured image IM1, and calculates the distance between the peripheral edge of the substrate W and the liquid landing position of the processing liquid Lq1 (that is, the liquid landing position with reference to the peripheral edge of the substrate W) based on the identified positional relationship and the table information.

The control unit 9 may determine whether or not the liquid landing position is within an appropriate range. For example, the control unit 9 determines whether or not the difference between the liquid landing position and a liquid landing reference value is larger than a predetermined allowable value. The liquid landing reference value is a target value of the liquid landing position and is preset. The allowable value is also preset. When the difference is larger than the allowable value, the control unit 9 may cause the notification unit 93 to notify the liquid landing position abnormality. Further, the control unit 9 may control the moving mechanism 33 to move the discharge nozzle 31 from the substrate peripheral position to the central portion of the substrate W by a predetermined width so that the liquid landing position is within an appropriate range.

<Imaging Optical System>

Figure 12:
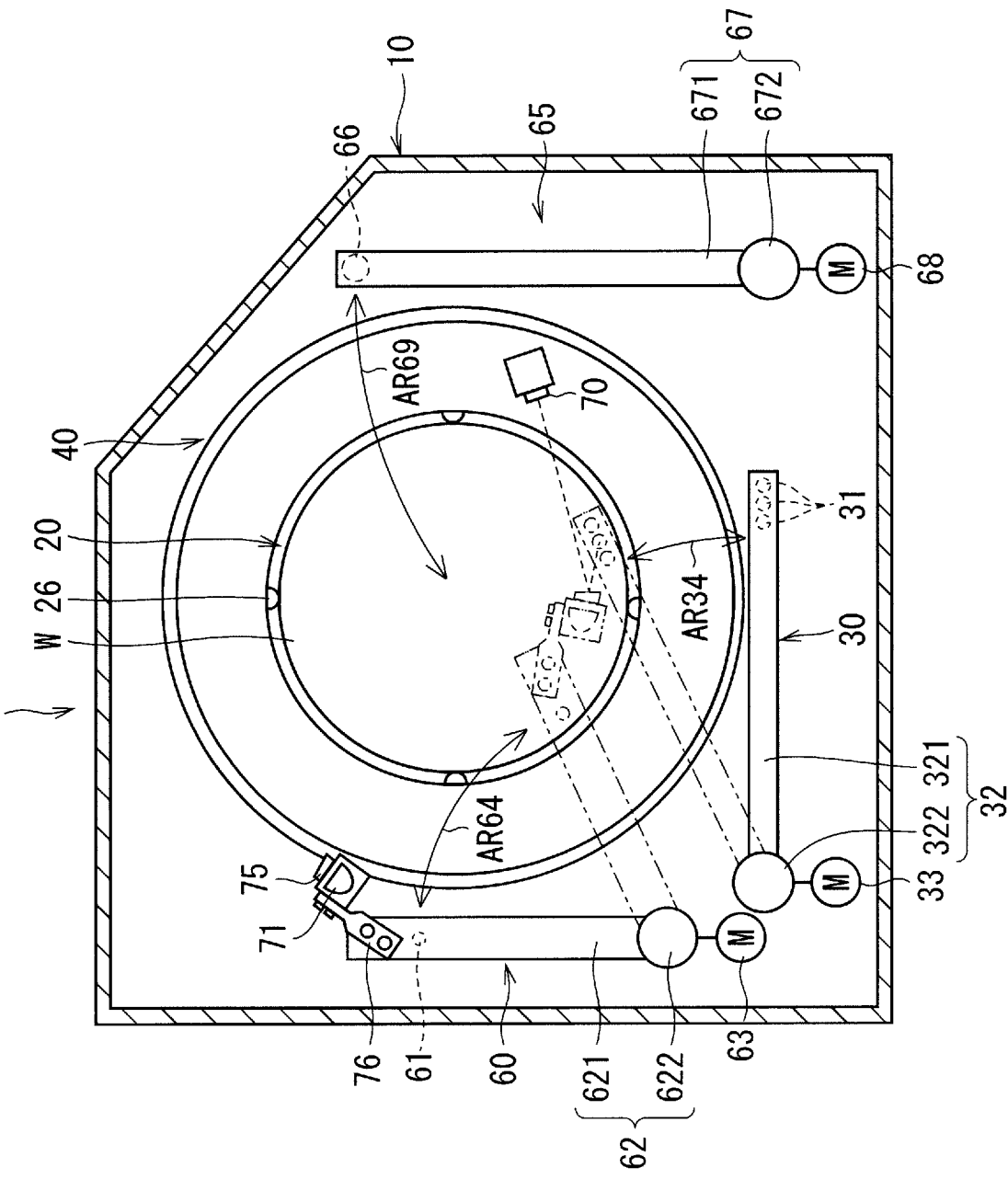
FIG. 12 is a plan view illustrating a schematic example of a configuration of a processing unit.

FIG. 12 is a diagram schematically illustrating an example of a configuration of a processing unit 1B. The processing unit 1B has a similar configuration to the processing unit 1 except for an imaging optical system. A mirror 75 is provided in the processing unit 1B. The mirror 75 is arranged at an imaging position above the substrate W, and the camera 70 is arranged in a region other than above the substrate W. As exemplified in FIG. 12, the camera 70 may be located above the processing cup 40 in a plan view. The mirror 75 reflects the light from the imaging region toward the light receiving surface of the camera 70. Therefore, the camera 70 can image the imaging region as viewed from the imaging position above the substrate W.

As exemplified in FIG. 12, the mirror 75 may be provided so as to be movable. In the example of FIG. 12, the mirror 75 is fixed to the fixing member 62 of the processing liquid supply unit 60. As a more specific example, a mirror holder 76 for holding the mirror 75 is provided, and the mirror holder 76 is connected to the nozzle arm 621 of the fixing member 62. For example, the mirror holder 76 is fixed to the tip portion of the nozzle arm 621 by a fastening member (for example, a screw) on the base end side of the mirror holder 76, and the mirror 75 is fixed and held by the fastening member on the tip side. The mirror holder 76 is formed of, for example, metal (for example, stainless steel) or the like. The moving mechanism 63 can reciprocate the mirror 75 between the imaging position above the substrate W and the standby position on the outer side than the processing cup 40 by rotating the nozzle base 622. By moving the mirror 75 to the imaging position with the moving mechanism 63, the light from the imaging region can be reflected from the mirror 75 to the camera 70.

The positional relationship in a plan view between the position of the mirror 75 (imaging position) and the discharge nozzle 31 is similar to the positional relationship between the position of the camera 70 (imaging position) and the discharge nozzle 31 in the processing unit 1. The imaging position is preferably close to the substrate W. For example, the imaging position may be set so that the lower end of the reflecting surface of the mirror 75 is the same as the upper end position of the processing cup 40 or lower than the upper end position. Alternatively, when the mirror holder 76 has a lower surface member arranged on the lower side of the mirror 75, the imaging position may be set that the lower end of the lower surface member is the same as the upper end position of the processing cup 40 or lower than the upper end position. In this manner, the camera 70 can image the imaging region as viewed from the imaging position along a direction closer to horizontal. That is, it is easy to align the imaging direction from the imaging position more horizontally.

According to the processing unit 1B, since the camera 70 can be arranged in a region other than above the substrate W, the influence of the processing liquid Lq1 on the camera 70 can be reduced. For example, it is possible to reduce the possibility that the processing liquid Lq1 is attached to the camera 70 or a vaporization component of the processing liquid Lq1 is attached to the camera 70. Therefore, even if the processing liquid Lq1 contains hydrofluoric acid, corrosion of the camera 70 is unlikely to be caused.

Note that the camera 70 may be fixed in the processing unit 1B so as to be substantially immovable, or may be fixed so as to be movable.

Further, the mirror 75 does not need to be fixed to the fixing member 62 of the processing liquid supply unit 60, and may be fixed to the fixing member 32 of the processing liquid supply unit 30 as in the camera 70 of the processing unit 1A. According to this, since the mirror 75 can be brought closer to the nozzle arm 321, the imaging direction from the imaging position can be easily aligned more with the circumferential direction.

<Pair of Illumination Units>

Figure 13:
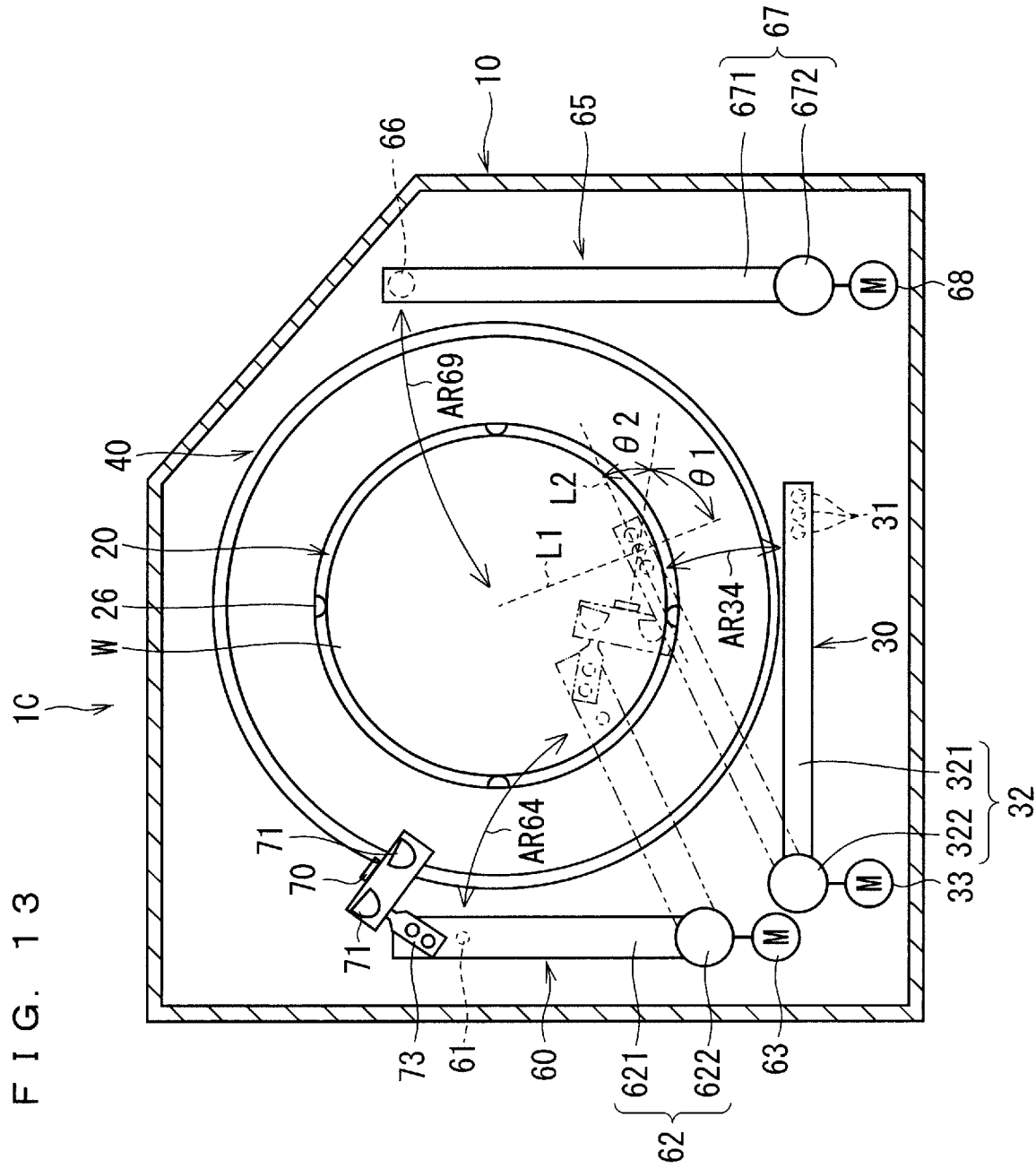
FIG. 13 is a plan view illustrating a schematic example of a configuration of a processing unit.

FIG. 13 is a diagram schematically illustrating an example of a configuration of a processing unit 1C. The processing unit 1C has a similar configuration to the processing unit 1 except for the illumination unit 71. In the processing unit 1C, a pair of the illumination units 71 are provided. A pair of the illumination units 71 emit light from both sides of the camera 70 in a plan view. A pair of the illumination units 71 may be located, for example, on the side of the camera 70, or may be located above the camera 70. A pair of the illumination units 71 may be held by the camera holder 73. A pair of the illumination units 71 may be arranged on the opposite sides each other against a group of the discharge nozzles 31 when viewed along the imaging direction in the imaging state in which the camera 70 and the discharge nozzle 31 are stopped at the imaging position and the processing position, respectively.

Since a pair of the illumination units 71 irradiate the imaging region with light from both sides of the discharge nozzle 31 in the imaging state, the luminance values at both ends of the processing liquid Lq1 discharged from the discharge nozzle 31 increase in the captured image IM1, and the contour of the processing liquid Lq1 is emphasized. That is, the difference between the luminance values of the pixels corresponding to both ends of the processing liquid Lq1 and the luminance value of a pixel corresponding to a region other than the processing liquid Lq1 increases. According to this, the control unit 9 can identify the positions of both ends of the processing liquid Lq1 with higher accuracy. As a result, the liquid column width and the discharge position can be obtained with higher accuracy.

<Machine Learning>

In the above example, the control unit 9 performs image processing on the captured image IM1 to obtain the liquid column width and the discharge position of the processing liquid Lq1 and determines whether or not these are within an appropriate range. However, the control unit 9 may make a determination using machine learning.

Figure 14:
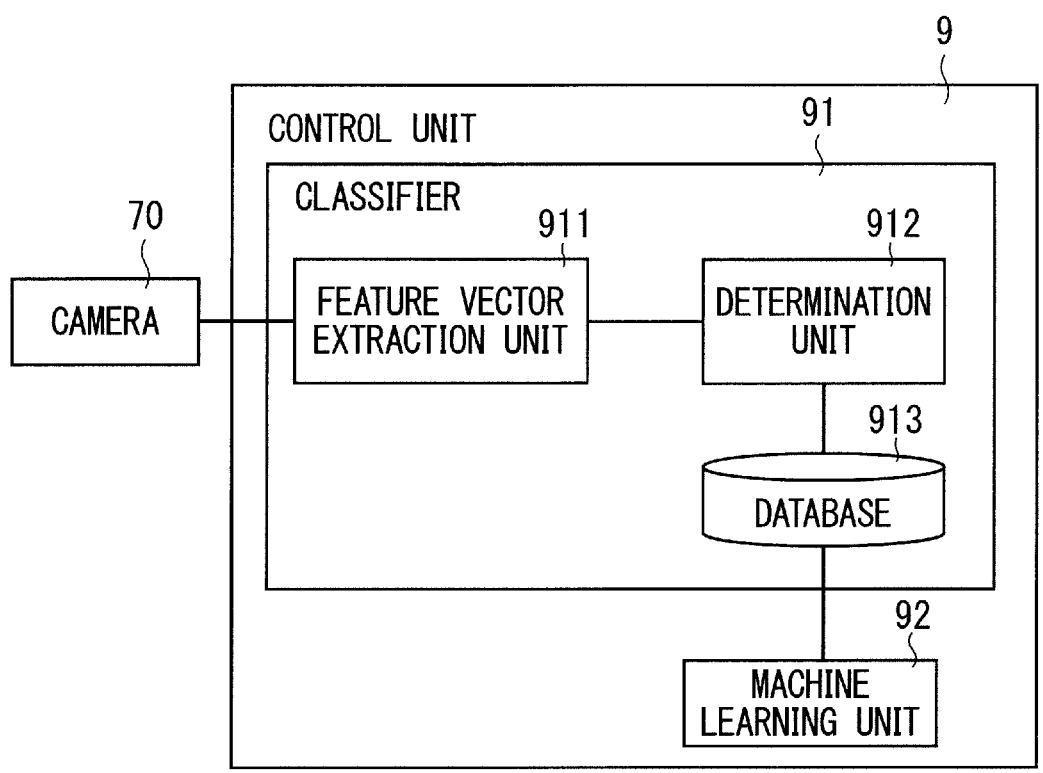
FIG. 14 is a functional block diagram schematically showing an example of an internal configuration of a control unit.

FIG. 14 is a diagram schematically illustrating an example of an internal configuration of the control unit 9. The control unit 9 includes a classifier 91 and a machine learning unit 92. The captured images IM1 from the camera 70 are sequentially input to the classifier 91. The classifier 91 classifies each of the input images IM1 into a category related to a discharge state amount (flow rate or discharge position) of the discharge nozzle 31. The category may also be referred to as a class. As the category, a category with abnormality in the discharge state amount and a category without abnormality can be employed. More specifically, a first category indicating that there is no abnormality in both the flow rate and the discharge position, a second category indicating that there is abnormality only in the flow rate, a third category indicating that there is abnormality only in the discharge position, and a fourth category indicating that there is abnormality in both the flow rate and the discharge position can be employed.

The classifier 91 is generated by the machine learning unit 92 using a plurality of pieces of training data. That is, it can be said that the classifier 91 is a machine-learned classifier. The machine learning unit 92 uses, for example, a neighbor algorithm, a support vector machine, a random forest, a neural network (including deep learning), or the like as a machine learning algorithm. Since the neural network automatically generates a feature amount, the designer does not need to determine a feature vector.

The training data includes image data and a label indicating which category the image data is classified into. The image data is a captured image captured by the camera 70 and is generated in advance. A correct category is assigned as a label to each piece of the image data. This assignment can be performed by the operator. The machine learning unit 92 performs machine learning based on these pieces of training data to generate the classifier 91.

As an example, the classifier 91 that classifies a frame by the neighbor algorithm will be described. The classifier 91 includes a feature vector extraction unit 911, a determination unit 912, and a storage medium in which a determination database 913 is stored. Frame of the captured image from the camera 70 are sequentially input to the feature vector extraction unit 911. The feature vector extraction unit 911 extracts a feature vector of the captured image IM1 according to a predetermined algorithm. This feature vector is a vector indicating a feature amount according to a discharge state of the discharge nozzle 31. A publicly-known algorithm can be employed as the algorithm. The feature vector extraction unit 911 outputs the feature vector to the determination unit 912.

The determination database 913 stores a plurality of feature vectors (hereinafter referred to as reference vectors) generated from a plurality of pieces of training data by the machine learning unit 92, and the reference vectors are classified into each category. Specifically, the machine learning unit 92 applies the same algorithm as the feature vector extraction unit 911 to a plurality of pieces of training data to generate a plurality of reference vectors. Then, the machine learning unit 92 assigns a label (correct category) of training data to the reference vectors.

The determination unit 912 classifies the captured image IM1 based on the feature vector input from the feature vector extraction unit 911 and a plurality of reference vectors stored in the determination database 913. For example, the determination unit 912 may identify a reference vector closest to a feature vector and classify the captured image IM1 into the category of the identified reference vector (nearest neighbor algorithm). In this manner, the determination unit 912 can classify the captured images input to the classifier 91 (feature vector extraction unit 911) into categories.

The control unit 9 classifies each of the captured images IM1 into one of the first category to the fourth category by the classifier 91. This classification means that whether or not the discharge state amount of the processing liquid Lq1 is within an appropriate range is determined. Since classification is performed by machine learning, abnormality can be detected with high accuracy.

Input to Classifier

In the above example, the entire region of the captured image IM1 is employed as the input data to the classifier 91. However, the input data is not necessarily limited to this. For example, the control unit 9 may cut out an image of the line segment region R2 from the captured image IM1 and input the image to the classifier 91. In this case, an image showing the line segment region R2 is employed also as the learning data input to the machine learning unit 92.

According to this, since the classifier 91 can perform classification whiling removing the influence of a region having low relevance to the discharge state, the classification accuracy can be improved.

Further, in a case where the line segment region R2 has a width corresponding to two or more pixels as the width in the vertical direction, an integral value group including, for each column, integral values which each is the sum of pixel values arranged in a column in the vertical direction of the line segment region R2 may be employed as the input data to the classifier 91.

<Server>

In the above example, the control unit 9 provided in the substrate processing apparatus 100 generates the classifier 91 by machine learning, and frames are classified by the classifier 91. However, at least a part of the machine learning functions (the classifier 91 and the machine learning unit 92) by the control unit 9 may be provided in a server.

Although the embodiment of the present substrate processing apparatus is described above, various modifications other than those described above can be made in the embodiment as long as the modifications do not deviate from the gist of the present invention. The various embodiments and modifications described above can be combined and performed as appropriate.

Further, the substrate W is described by employing a semiconductor substrate. However, the present invention is not limited to this. For example, a substrate such as a glass substrate for a photo mask, a glass substrate for a liquid crystal display, a glass substrate for a plasma display, a substrate for a field emission display (FED), an optical disk substrate, a magnetic disk substrate, a magneto-optical disk substrate, or the like may be employed.

EXPLANATION OF REFERENCE SIGNS

20: substrate holder
31: first nozzle (discharge nozzle)
33, 63: moving mechanism
40: cup member (processing cup)
44: elevating mechanism
66, 69: second nozzle (discharge nozzle)
70: camera
75: mirror
91: notification unit
91: classifier
100: substrate processing apparatus
W: substrate

The invention claimed is:
1. A substrate processing apparatus comprising:
a substrate holder that holds a substrate and rotates said substrate;
a cup member that surrounds an outer circumference of said substrate holder;
an elevating mechanism that moves up said cup member so that an upper end portion of said cup member is located at an upper end position higher than said substrate held by said substrate holder;
a first nozzle that has a discharge port at a position lower than said upper end position and discharges first processing liquid from said discharge port to an end portion of said substrate; and
a camera that images an imaging region that includes the first processing liquid discharged from said discharge port of said first nozzle and is viewed from an imaging position above said substrate, wherein
a radial direction of said imaging position with respect to said substrate is located closer to a center of said substrate than a radial direction of said first nozzle.

2. A substrate processing apparatus comprising:
a substrate holder that holds a substrate and rotates said substrate;
a cup member that surrounds an outer circumference of said substrate holder;
an elevating mechanism that moves up said cup member so that an upper end portion of said cup member is located at an upper end position higher than said substrate held by said substrate holder;
a first nozzle that has a discharge port at a position lower than said upper end position and discharges first processing liquid from said discharge port to an end portion of said substrate;
a camera that images an imaging region that includes the first processing liquid discharged from said discharge port of said first nozzle and is viewed from an imaging position above said substrate, and
a moving mechanism that moves said camera to said imaging position above said substrate, wherein
said imaging position is a position where a height position of a lower end of a light receiving surface of said camera is same as said upper end position of said cup member or a position lower than the upper end position.

3. A substrate processing apparatus comprising:
a substrate holder that holds a substrate and rotates said substrate;
a cup member that surrounds an outer circumference of said substrate holder;
an elevating mechanism that moves up said cup member so that an upper end portion of said cup member is located at an upper end position higher than said substrate held by said substrate holder;
a first nozzle that has a discharge port at a position lower than said upper end position and discharges first processing liquid from said discharge port to an end portion of said substrate;
a camera that images an imaging region that includes the first processing liquid discharged from said discharge port of said first nozzle and is viewed from an imaging position above said substrate,
a mirror; and
a moving mechanism that moves said mirror, wherein
said camera is arranged in a region other than above said substrate, and said moving mechanism moves said mirror to said imaging position above said substrate to cause said mirror to reflect light from said imaging region to said camera.

4. The substrate processing apparatus according to claim 3, wherein
said moving mechanism moves said mirror to a position where a lower end of a reflecting surface of said mirror is same as said upper end position of said cup member or a position lower than the upper end position.

5. A substrate processing apparatus comprising:
a substrate holder that holds a substrate and rotates said substrate;
a cup member that surrounds an outer circumference of said substrate holder;
an elevating mechanism that moves up said cup member so that an upper end portion of said cup member is located at an upper end position higher than said substrate held by said substrate holder;
a first nozzle that has a discharge port at a position lower than said upper end position and discharges first processing liquid from said discharge port to an end portion of said substrate;
a camera that images an imaging region that includes the first processing liquid discharged from said discharge port of said first nozzle and is viewed from an imaging position above said substrate, wherein
said imaging position is a position on an upstream side in a rotation direction of said substrate with respect to said first nozzle.

6. The substrate processing apparatus according to claim 1, further comprising
a moving mechanism that moves said camera to said imaging position above said substrate, wherein
said first processing liquid contains hydrofluoric acid, and
a lower portion of said camera is covered with chemical resistant resin or metal.

7. The substrate processing apparatus according to claim 1, further comprising:
a fixing member for fixing said first nozzle; and
a moving mechanism that displaces said fixing member to move said first nozzle to above said end portion of said substrate, wherein
said camera is fixed to said fixing member.

8. A substrate processing apparatus comprising:
a substrate holder that holds a substrate and rotates said substrate;
a cup member that surrounds an outer circumference of said substrate holder;
an elevating mechanism that moves up said cup member so that an upper end portion of said cup member is located at an upper end position higher than said substrate held by said substrate holder;
a first nozzle that has a discharge port at a position lower than said upper end position and discharges first processing liquid from said discharge port to an end portion of said substrate;
a camera that images an imaging region that includes the first processing liquid discharged from said discharge port of said first nozzle and is viewed from an imaging position above said substrate,
a second nozzle that discharges second processing liquid to said substrate;
a fixing member for fixing said second nozzle; and
a first moving mechanism that displaces said fixing member to move said second nozzle to above said substrate, wherein
said camera is fixed to said fixing member.

9. A substrate processing apparatus comprising:
a substrate holder that holds a substrate and rotates said substrate;
a cup member that surrounds an outer circumference of said substrate holder;
an elevating mechanism that moves up said cup member so that an upper end portion of said cup member is located at an upper end position higher than said substrate held by said substrate holder;
a first nozzle that has a discharge port at a position lower than said upper end position and discharges first processing liquid from said discharge port to an end portion of said substrate;
a camera that images an imaging region that includes the first processing liquid discharged from said discharge port of said first nozzle and is viewed from an imaging position above said substrate, wherein
said imaging region is an imaging region viewed along a direction closer to a circumferential direction than a radial direction of said substrate.

10. A substrate processing method comprising, in the substrate processing apparatus including a substrate holder that holds a substrate and rotates said substrate;
a cup member that surrounds an outer circumference of said substrate holder;
an elevating mechanism that moves up said cup member so that an upper end portion of said cup member is located at an upper end position higher than said substrate held by said substrate holder;
a first nozzle that has a discharge port at a position lower than said upper end position and discharges first processing liquid from said discharge port to an end portion of said substrate;
a camera that images an imaging region that includes the first processing liquid discharged from said discharge port of said first nozzle and is viewed from an imaging position above said substrate:
a holding step of holding a substrate by said substrate holder;
a substrate rotation step of rotating said substrate holder that holds said substrate;
a bevel processing step of discharging said first processing liquid from said first nozzle to an end portion of said substrate; and
a bevel monitoring step of monitoring a discharge state of said first processing liquid based on a captured image acquired by said camera imaging said imaging region, wherein
in said bevel monitoring step, a discharge state amount, which is a liquid column width or a discharge position of processing liquid discharged from a tip of said first nozzle, is obtained based on luminance values of pixels in a region located directly below said first nozzle and longer in a lateral direction than a length in a vertical direction in said captured image, and
said region is set to a position including a part of said first processing liquid reflected on an upper surface of a substrate by specular reflection in said captured image.

11. The substrate processing method according to claim 10, wherein
in said bevel processing step, said first processing liquid is discharged to said substrate from two or more discharge ports.

12. The substrate processing method according to claim 10, wherein
said bevel monitoring step includes
a step of obtaining a median or an average value of the discharge state amounts as a reference value, and
a step of determining that abnormality has occurred in said first processing liquid when a difference between said discharge state amount and said reference value is equal to or more than a predetermined value.

13. The substrate processing method according to claim 10, wherein
exposure time of said camera is set to time required for one rotation of a substrate or longer.

14. The substrate processing method according to claim 10, wherein
said discharge state amount is obtained based on luminance values of pixels in said region in a captured image obtained by integrating or averaging a plurality of captured images acquired by said camera within time required for one rotation of a substrate or longer.

15. A substrate processing method comprising, in the substrate processing apparatus including a substrate holder that holds a substrate and rotates said substrate;
a cup member that surrounds an outer circumference of said substrate holder;
an elevating mechanism that moves up said cup member so that an upper end portion of said cup member is located at an upper end position higher than said substrate held by said substrate holder;
a first nozzle that has a discharge port at a position lower than said upper end position and discharges first processing liquid from said discharge port to an end portion of said substrate;
a camera that images an imaging region that includes the first processing liquid discharged from said discharge port of said first nozzle and is viewed from an imaging position above said substrate:
a holding step of holding a substrate by said substrate holder;
a substrate rotation step of rotating said substrate holder that holds said substrate;
a bevel processing step of discharging said first processing liquid from said first nozzle to an end portion of said substrate; and
a bevel monitoring step of monitoring a discharge state of said first processing liquid based on a captured image acquired by said camera imaging said imaging region, wherein
in said bevel monitoring step, a machine-learned classifier classifies said captured image into either a category without abnormality regarding a liquid column width or a discharge position of processing liquid discharged from a tip of said first nozzle, or a category with abnormality.

16. The substrate processing method according to claim 15, wherein
in said bevel monitoring step, a region located directly below said first nozzle and longer in a lateral direction than a length in a vertical direction is cut out from said captured image, and an image of the cut out region is input to said classifier.

17. The substrate processing method according to claim 10, wherein
said captured image includes a part of a peripheral edge of said substrate, and
said bevel processing step includes
a step of obtaining a substrate peripheral position of a part of a peripheral edge of said substrate based on said captured image, and
a step of moving said first nozzle to a processing position on a central side of said substrate by a predetermined width from said substrate peripheral position.

18. The substrate processing apparatus according to claim 1, further comprising:
a second nozzle that discharges second processing liquid to said substrate;
a fixing member for fixing said second nozzle; and
a moving mechanism that displaces said fixing member to move said second nozzle to above said substrate, wherein
said camera is fixed to said fixing member.

19. The substrate processing apparatus according to claim 8, further comprising:
a second moving mechanism to move said first nozzle, said second moving mechanism different form said first moving mechanism.

* * * * *